United States Patent
Yun et al.

(10) Patent No.: US 10,290,414 B2
(45) Date of Patent: May 14, 2019

(54) SUBSTRATE COMPRISING AN EMBEDDED INDUCTOR AND A THIN FILM MAGNETIC CORE

(71) Applicant: QUALCOMM Incorporated, San Diego, CA (US)

(72) Inventors: Changhan Hobie Yun, San Diego, CA (US); Mario Francisco Velez, San Diego, CA (US); Chengjie Zuo, San Diego, CA (US); Daeik Daniel Kim, Del Mar, CA (US); David Francis Berdy, San Diego, CA (US); Je-Hsiung Jeffrey Lan, San Diego, CA (US); Jonghae Kim, San Diego, CA (US); Niranjan Sunil Mudakatte, San Diego, CA (US); Robert Paul Mikulka, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 22 days.

(21) Appl. No.: 14/841,132

(22) Filed: Aug. 31, 2015

(65) Prior Publication Data

US 2017/0062120 A1   Mar. 2, 2017

(51) Int. Cl.
*H01F 5/00* (2006.01)
*H01F 27/28* (2006.01)
(Continued)

(52) U.S. Cl.
CPC ..... *H01F 27/2804* (2013.01); *H01F 17/0033* (2013.01); *H01F 27/245* (2013.01);
(Continued)

(58) Field of Classification Search
CPC ............... H01F 27/2804; H01F 27/245; H01F 2027/2809
(Continued)

(56) References Cited

U.S. PATENT DOCUMENTS 5,055,816 A * 10/1991 Altman ............... H01F 17/0033
29/602.1
5,828,215 A * 10/1998 Boettcher ........ G01R 33/56308
324/306

(Continued)

OTHER PUBLICATIONS

International Search Report and Written Opinion—PCT/US2016/049512—ISA/EPO—Jan. 31, 2017.

*Primary Examiner* — Elvin G Enad
*Assistant Examiner* — Kazi S Hossain
(74) *Attorney, Agent, or Firm* — Qualcomm Incorporated

(57) ABSTRACT

A substrate includes a first dielectric layer, a magnetic core at least partially in the first dielectric layer, where the magnetic core comprises a first non-horizontal thin film magnetic (TFM) layer. The substrate also includes a first inductor that includes a plurality of first interconnects, where the first inductor is positioned in the substrate to at least partially surround the magnetic core. The magnetic core may further include a second non-horizontal thin film magnetic (TFM) layer. The magnetic core may further include a core layer. The magnetic core may further include a third thin film magnetic (TFM) layer, and a fourth thin film magnetic (TFM) layer that is substantially parallel to the third thin film magnetic (TFM) layer.

20 Claims, 22 Drawing Sheets

Magnetic Core With Magnetic Layers

(51) Int. Cl.
*H01F 27/245* (2006.01)
*H01F 41/14* (2006.01)
*H01F 41/04* (2006.01)
*H01F 17/00* (2006.01)
*H01F 41/32* (2006.01)
*H01L 23/64* (2006.01)
*H05K 1/16* (2006.01)

(52) U.S. Cl.
CPC ......... *H01F 41/042* (2013.01); *H01F 41/046* (2013.01); *H01F 41/14* (2013.01); *H01F 41/32* (2013.01); *H01L 23/645* (2013.01); *H05K 1/165* (2013.01); *H01F 2027/2809* (2013.01)

(58) Field of Classification Search
USPC ................................. 336/200, 232; 257/331
See application file for complete search history.

(56) References Cited

U.S. PATENT DOCUMENTS

| | | | |
|---|---|---|---|
| 5,838,215 A | 11/1998 | Gu et al. | |
| 6,140,902 A * | 10/2000 | Yamasawa | H01F 10/187 336/200 |
| 6,240,622 B1 | 6/2001 | Ahn et al. | |
| 6,531,945 B1 | 3/2003 | Ahn et al. | |
| 8,093,982 B2 | 1/2012 | Kim et al. | |
| 8,558,344 B2 * | 10/2013 | Chen | H01L 28/10 257/528 |
| 8,911,876 B2 * | 12/2014 | Zhou | B44C 1/22 148/561 |
| 2002/0110757 A1 * | 8/2002 | Fork | H01F 17/0033 430/320 |
| 2004/0124961 A1 * | 7/2004 | Aoyagi | H01F 17/0033 336/200 |
| 2007/0188920 A1 * | 8/2007 | Choi | H01F 10/131 360/125.01 |
| 2008/0106364 A1 * | 5/2008 | Orlando | H01F 17/0033 336/212 |
| 2014/0111273 A1 * | 4/2014 | Jou | H01L 24/18 327/564 |
| 2014/0264732 A1 | 9/2014 | Elsherbini et al. | |
| 2014/0264734 A1 * | 9/2014 | Luo | H01L 23/147 257/531 |
| 2015/0137342 A1 | 5/2015 | Sutardja | |

* cited by examiner

Magnetic Core

Patterned Magnetic Core

PLAN VIEW
(E.G., TOP VIEW)

PLAN VIEW
(E.G., TOP VIEW)

PLAN VIEW
(E.G., TOP VIEW)

Magnetic Core With Magnetic Layers

Magnetic Core With Patterned Magnetic Layers

1006  TOP PLAN VIEW

1006  BOTTOM PLAN VIEW

1006  RIGHT PROFILE VIEW

1006  LEFT PROFILE VIEW

PLAN VIEW
(E.G., TOP VIEW)

PLAN VIEW
(E.G., TOP VIEW)

US 10,290,414 B2

SUBSTRATE COMPRISING AN EMBEDDED INDUCTOR AND A THIN FILM MAGNETIC CORE

BACKGROUND

Field

Various features relate to an substrate, and more specifically to a substrate that includes an embedded inductor and a thin film magnetic core.

Background

FIG. 1 illustrates an integrated circuit (IC) package that includes a die. Specifically, FIG. 1 illustrates an integrated circuit (IC) package 100 that includes a first die 102 and a package substrate 106. The package substrate 106 includes a dielectric layer and a plurality of interconnects 110. The package substrate 106 is a laminated substrate. The plurality of interconnects 110 includes traces, pads and/or vias. The first die 102 is coupled to the package substrate 106 through a first plurality of solder balls 112. The package substrate 106 is coupled to a printed circuit board (PCB) 108 through a second plurality of solder balls 116. FIG. 1 illustrates that an inductor 120 is mounted on the PCB 108. The inductor 120 is located externally to the integrated (IC) circuit package 100, and takes up a lot real estate on the PCB 108.

One drawback of the inductor 120 shown in FIG. 1 is that it creates a device with a form factor that may be too large for the needs of mobile computing devices and/or wearable computing devices. This may result in a device that is either too large and/or too thick. That is, the combination of the integrated circuit (IC) package 100, the inductor 120 and the PCB 108 shown in FIG. 1 may be too thick and/or have a surface area that is too large to meet the needs and/or requirements of mobile computing devices and/or wearable computing devices.

Therefore, there is a need for an integrated circuit (IC) package or substrate that includes an inductor, where the integrated circuit (IC) package or substrate has a better form factor, while at the same time meeting the needs and/or requirements of mobile computing devices and/or wearable computing devices.

SUMMARY

Various features relate to an substrate, and more specifically to a substrate that includes an embedded inductor and a thin film magnetic core One example provides a substrate includes a first dielectric layer, a magnetic core at least partially in the first dielectric layer, where the magnetic core comprises a first non-horizontal thin film magnetic (TFM) layer. The substrate also includes a first inductor that includes a plurality of first interconnects, where the first inductor is positioned in the substrate to at least partially surround the magnetic core.

Another example provides a method for fabricating a substrate. The method forms a first dielectric layer. The method forms a first non-horizontal thin film magnetic (TFM) layer in the first dielectric layer, to form a magnetic core that is at least partially in the first dielectric layer. The method forms a plurality of first interconnects in at least the first dielectric layer to form a first inductor that at least partially surrounds the magnetic core.

DRAWINGS

Various features, nature and advantages may become apparent from the detailed description set forth below when taken in conjunction with the drawings in which like reference characters identify correspondingly throughout.

DETAILED DESCRIPTION

Figure 1:
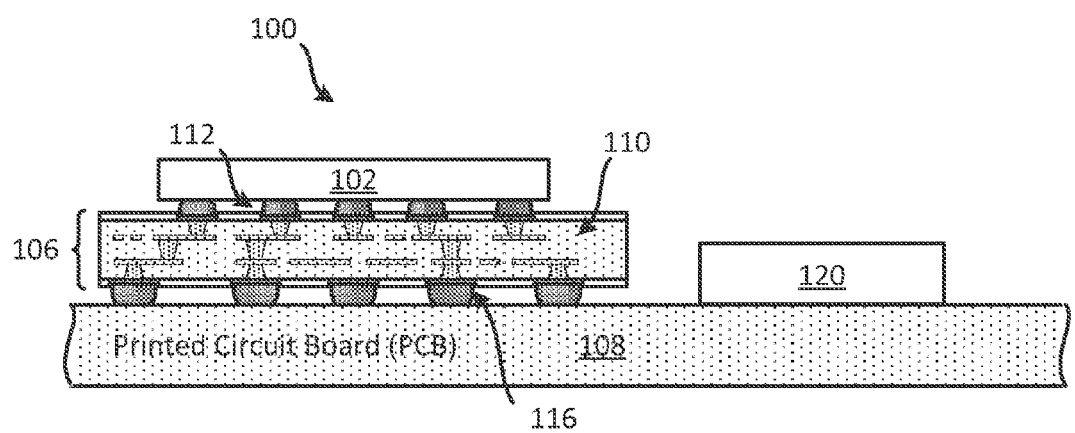
FIG. 1 illustrates an integrated circuit (IC) package.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes an integrated circuit (IC) package that includes a die and a package substrate. The die is coupled to (e.g., mounted on) the package substrate. The package substrate includes a first dielectric layer, a magnetic core at least partially in the first dielectric layer, and a first inductor. The magnetic core includes a first thin film magnetic (TFM) layer, a second thin film magnetic (TFM) layer, a third thin film magnetic (TFM) layer, and a fourth thin film magnetic (TFM) layer. The first inductor includes several first interconnects. The first inductor is positioned in the package substrate to at least partially surround the magnetic core. In some implementations, the first thin TFM layer is a first side TFM layer that vertically traverses the first dielectric layer. In some implementations, the magnetic core is a patterned magnetic core that includes a first patterned thin film magnetic (TFM) layer and a second patterned thin film magnetic (TFM) layer.

In some implementations, a height of the integrated circuit (IC) package and/or a substrate may be defined along the Z-direction of the integrated circuit (IC) package and/or the substrate, which is shown in the figures of the present disclosure. In some implementations, the Z-direction of the integrated circuit (IC) package may be defined along an axis (e.g., vertical axis) between a top portion and a bottom portion of the integrated circuit (IC) package. The Z-direction may be referred to as the vertical direction, and vice versa. The terms top and bottom may be arbitrarily assigned, however as an example, the top portion of the integrated circuit (IC) package may be a portion comprising an encapsulation layer, while a bottom portion of the device package may be a portion comprising a plurality of solder balls. In some implementations, the top portion of the integrated circuit (IC) package may be a back side of the integrated circuit (IC) package, and the bottom portion of the integrated circuit (IC) package may be a front side of the integrated circuit (IC) package. The front side of the integrated circuit (IC) package may be an active side of the integrated circuit (IC) package. A top portion may be a higher portion relative to a lower portion. A bottom portion may be a lower portion relative to a higher portion. Further examples of top portions and bottom portions will be further described below. The X-Y directions of the integrated circuit (IC) package may refer to the lateral direction and/or footprint of the integrated circuit (IC) package. Examples of X-Y directions are shown in the figures of the present disclosure and/or further described below. The X direction and/or the Y direction may be referred as the horizontal direction, and vice versa. In many of the figures of the present disclosure, the integrated circuit (IC) packages and their respective components are shown across a X-Z cross-section or X-Z plane. However, in some implementations, the integrated circuit (IC) packages and their representative components may be represented across a Y-Z cross-section or Y-Z plane.

Figure 2:
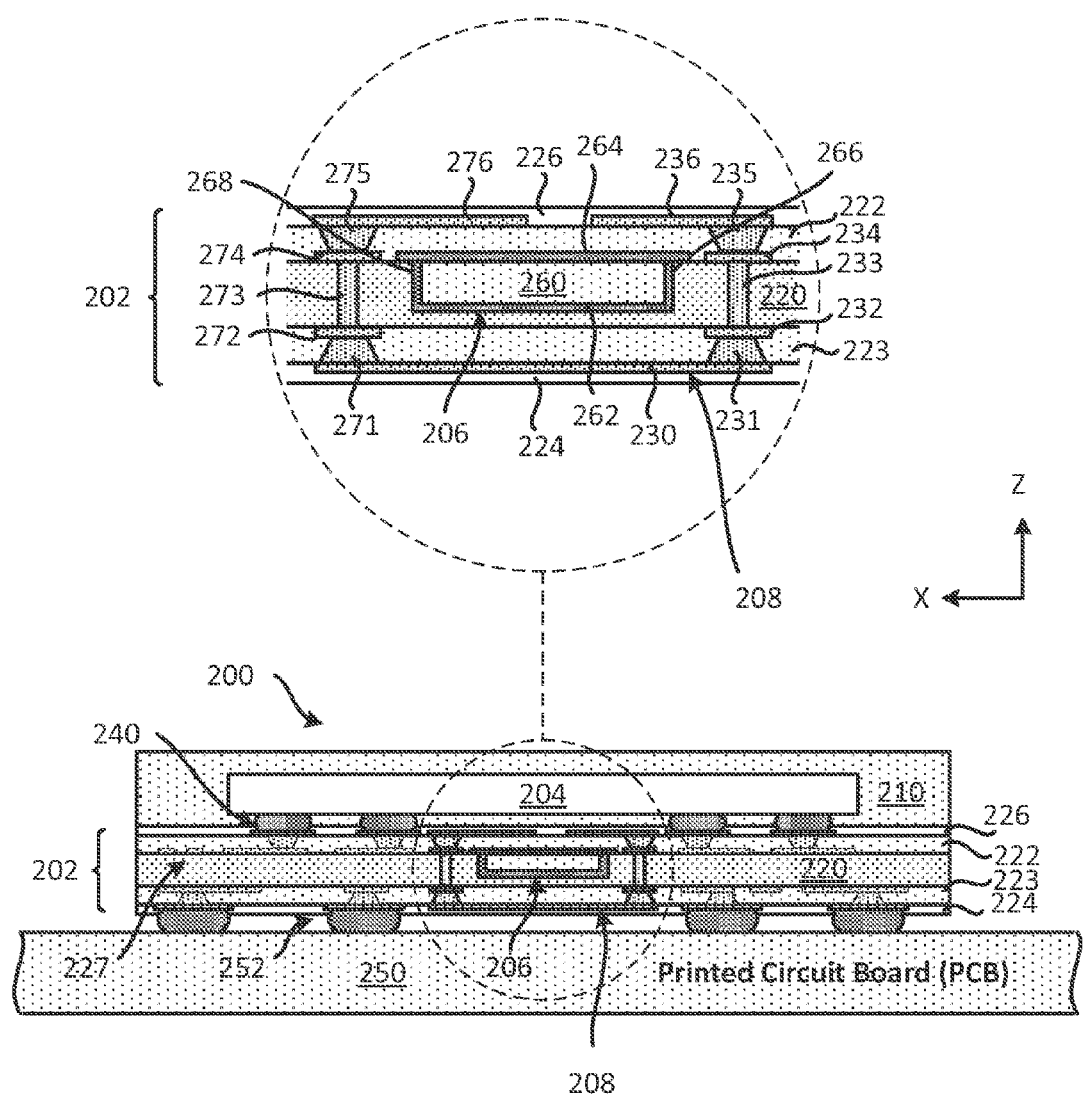
FIG. 2 illustrates a profile view of an example of an integrated circuit (IC) package that includes a magnetic core inductor embedded in a package substrate.

Exemplary Integrated Circuit Package Comprising a Thin Film Magnetic Core with an Inductor in a Package Substrate FIG. 2 illustrates an example of an integrated circuit (IC) package that includes a thin film magnetic core with an inductor embedded in a package substrate. Specifically, FIG. 2 illustrates an example of an integrated circuit package 200 that includes a substrate 202, a die 204, a magnetic core 206, an inductor 208 and an encapsulation layer 210. The integrated circuit package 200 is mounted on a printed circuit board (PCB) 250. The die 204 may be an integrated circuit (IC) that includes several transistors and/or other electronic components. The die 204 may be a logic die and/or a memory die.

The substrate 202 may be a package substrate and/or an interposer of an integrated device. The die 204 is coupled (e.g., mounted) to the substrate 202. More specifically, the die 204 is coupled to the substrate 202 through a first plurality of solder balls 240. In some implementations, the die 204 may be coupled to the substrate 202 differently.

The substrate 202 includes a first dielectric layer 220, a second dielectric layer 222, a third dielectric layer 223, a first solder resist layer 224, a second solder resist layer 226, and the interconnects 227. The first dielectric layer 220 may be a substrate core layer. In some implementations, the first dielectric layer 220 may be a prepeg layer. The second dielectric layer 222 and the third dielectric layer 223 may be one or more dielectric layers (e.g., one or more prepeg layers). The interconnects 227 may include traces, pads and/or vias, that are formed in the first dielectric layer 220, the second dielectric layer 222 and/or the third dielectric layer 223. The first solder resist layer 224 is formed on a first surface (e.g., bottom surface, surface facing the PCB 250, on the third dielectric layer 223) of the substrate 202. The second solder resist layer 226 is formed on a second surface (e.g., top surface, surface facing the die 204, on the second dielectric layer 222) of the substrate 202.

As shown in FIG. 2, the magnetic core 206 is embedded in the substrate 202. More specifically, the magnetic core 206 is located in a cavity of the first dielectric layer 220 (e.g., substrate core layer). The cavity of the first dielectric layer 220 is filled with a dielectric layer 260. The dielectric layer 260 is located within the magnetic core 206. The second dielectric layer 222 surrounds a portion of the magnetic core 206. Thus, in the example of FIG. 2, the magnetic core 206 is at least partially surrounded by the first dielectric layer 220 and at least partially surrounded by the second dielectric layer 222.

The magnetic core 206 comprises a thin film magnetic core. In some implementations, the magnetic core 206 comprises a thin wall magnetic core, where the thin wall has a thickness of about 3 (μm) microns or less.

The magnetic core 206 includes a first magnetic layer 266, a second magnetic layer 268, a third magnetic layer 262, and a fourth magnetic layer 264. In some implementations, the first magnetic layer 266, the second magnetic layer 268, the third magnetic layer 262, and the fourth magnetic layer 264 are thin film magnetic (TFM) layers. The first magnetic layer 266 is formed on a first surface (e.g., side surface) of the dielectric layer 260. The first magnetic layer 266 may be a non horizontal thin film magnetic (TFM) layer (e.g., vertical thin film magnetic (TFM) layer that vertically traverses the substrate 202). The second magnetic layer 268 is formed on a second surface (e.g., side surface) of the dielectric layer 260. The second magnetic layer 268 may be a non-horizontal thin film magnetic (TFM) layer (e.g., vertical thin film magnetic (TFM) layer that vertically traverses the substrate 202). The third magnetic layer 262 is formed on a third surface (e.g., bottom surface) of the dielectric layer 260, and the fourth magnetic layer 264 is formed on a fourth surface (e.g., top surface) of the dielectric layer 260. The magnetic core 206 is at least partially surrounded by the inductor 208. Examples of magnetic cores are further described in detail in FIGS. 3-4.

The inductor 208 is at least partially embedded in the substrate 202. The inductor 208 is formed in the substrate 202 such that the inductor 208 at least partially surrounds the magnetic core 206. In some implementations, the magnetic core 206 helps increase the inductance of the inductor 208, and helps provides an inductor with a high quality (Q) factor, and low resistance. Examples of a magnetic core in an inductor are further described and illustrated below in at least FIGS. 6-7.

In some implementations, the inductor 208 is a solenoid inductor. The inductor 208 includes one or more windings, a first terminal, and a second terminal. The one or more windings and terminals of the inductor 208 may be defined by interconnects in and/or on the substrate 202, in some implementations, the substrate 202 may include more than one inductor (e.g., first inductor, second inductor). These two or more inductors may be configured to operate as a coupled inductor or a transformer. Examples of more than one inductor in a substrate are further described and illustrated below in at least FIGS. 22-23.

As shown in FIG. 2, the inductor 208 (e.g., first inductor) includes a plurality of first interconnects. More specifically, the inductor 208 includes an interconnect 230, an interconnect 231, an interconnect 232, an interconnect 233, an interconnect 234, an interconnect 235, an interconnect 236, an interconnect 271, an interconnect 272, an interconnect 273, an interconnect 274, an interconnect 275, and an interconnect 276.

An interconnect is an element or component of a device (e.g., integrated device, integrated circuit (IC) package, die) and/or a base (e.g., package substrate, printed circuit board, interposer) that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that is capable of providing an electrical path for a signal (e.g., data signal, ground signal, power signal). An interconnect may include more than one element/component.

The interconnects 230, 236 and 276 may be traces. The interconnects 231, 233, 235, 271, 273, and 275 may be vias. The interconnects 232, 234, 272, and 274 may be pads. In some implementations the interconnects 230-236 and 271-276 may define one or more windings of the inductor 208. The windings of an inductor are further described and illustrated below in at least FIGS. 5-7.

The encapsulation layer 210 at least partially encapsulates the die 204. The encapsulation layer 210 may include a mold and/or an epoxy fill. In some implementations, the encapsulation layer 210 may be a litho-patternable layer. A litho-patternable layer/material that is a material that is photo etchable. That is, the litho-patternable layer/material is made of a material that can be etched and/or removed (e.g., through a lithography process) through the exposure of the material to a light source (e.g., ultraviolet (UV) light) through a mask (e.g., photomask).

As mentioned above, FIG. 2 further illustrates that the integrated circuit package 200 is coupled (e.g., mounted) on the printed circuit board (PCB) 250 through a second plurality of solder balls 252. More specifically, the substrate 202 of the integrated circuit package 200 is coupled to the PCB 250 through the second plurality of solder balls 252. In some implementations, the integrated circuit package 200 may be coupled to the PCB 250 differently.

Exemplary Thin Film Magnetic Cores

Figure 3:
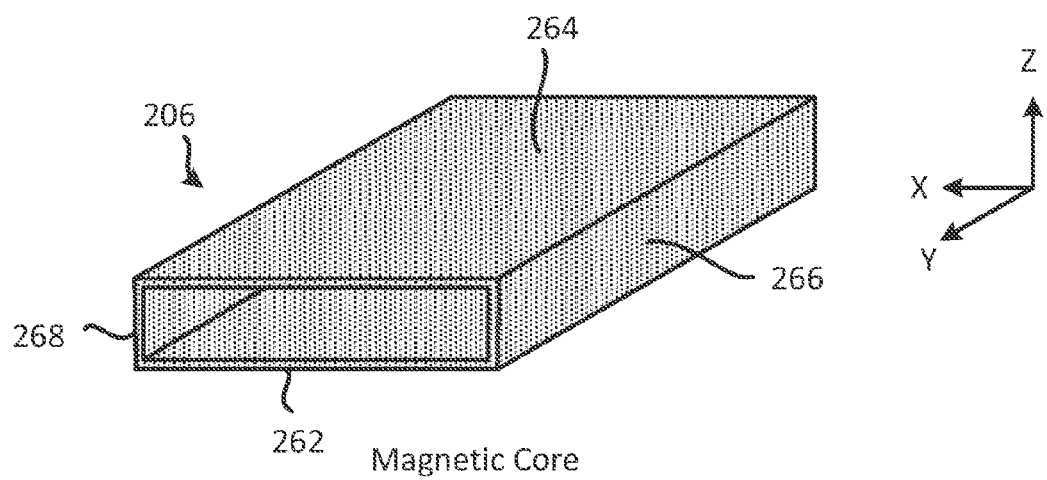
FIG. 3 illustrates a thin film inductor magnetic core.

FIG. 3 illustrates a standalone view of the magnetic core 206 (also see discussion of FIG. 2). As shown in FIG. 3, the magnetic core 206 includes the first magnetic layer 266, the second magnetic layer 268, the third magnetic layer 262, and the fourth magnetic layer 264. In other words, in the example shown, at least two sides of FIG. 3 do not have a magnetic layer. In an alternative example not shown, the magnetic core 206 may have magnetic layers only on the sides (e.g. 268 and 266) of FIG. 3 or on the sides (e.g. 268 and 266) and on other sides (e.g. 264 and/or 262 and/or the side opposite and perpendicular to 268 and 266, etc). In some implementations, the first magnetic layer 266, the second magnetic layer 268, the third magnetic layer 262, and the fourth magnetic layer 264 may be thin film magnetic (TFM) layers.

In some implementations, the first magnetic layer 266, the second magnetic layer 268, the third magnetic layer 262 (e.g., first side magnetic layer), and the fourth magnetic layer 264 (e.g., second side magnetic layer) may have a thickness of about 3 microns (μm) or less (e.g., about 1-2 microns (μm)). The shape and/or size of the magnetic core 206 may vary with different implementations. As discussed in FIG. 2, the magnetic core 206 may be filled with the dielectric layer 260 (see FIG. 2).

The first magnetic layer 266 may be a non-horizontal thin film magnetic (TFM) layer (e.g., vertical thin film magnetic (TFM) layer that vertically traverses a dielectric layer). The second magnetic layer 268 may be a non-horizontal thin film magnetic (TFM) layer (e.g., vertical thin film magnetic (TFM) layer that vertically traverses a dielectric layer). The third magnetic layer 262 and the fourth magnetic layer 264 may be substantially horizontal thin film magnetic (TFM) layers. The fourth magnetic layer 264 may be substantially parallel to the third magnetic layer 262.

Figure 4:
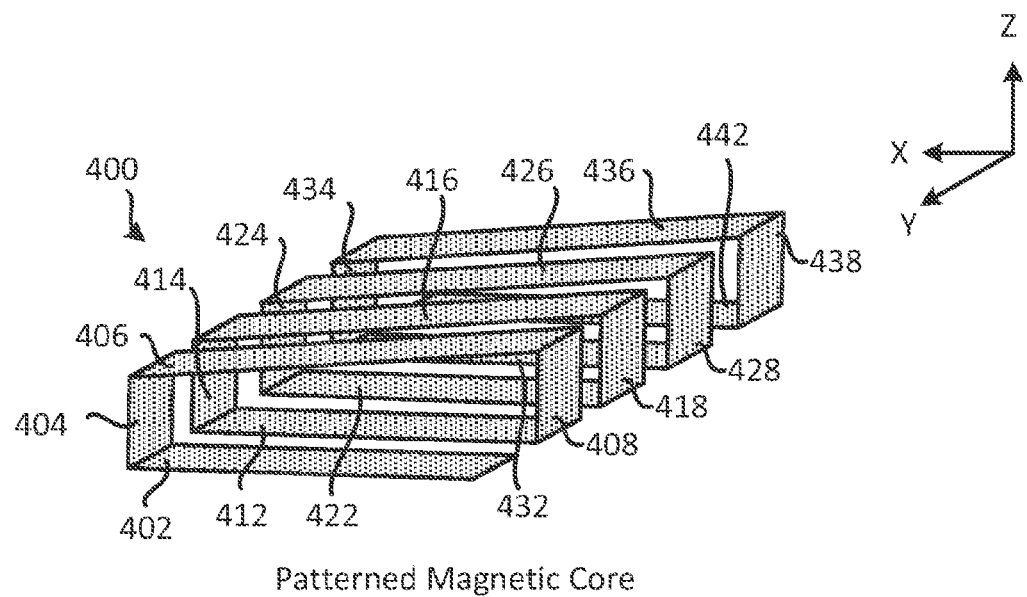
FIG. 4 illustrates a patterned thin film magnetic core.

FIG. 4 illustrates a standalone view of a patterned magnetic core 400, in some implementations, the patterned magnetic core 400 may be implemented in the substrate 202. In some implementations, the patterned magnetic core 400 may be used instead of the magnetic core 206 in the substrate 202. In some implementations, the patterned magnetic core 400 is a patterned thin wall magnetic core, where the thin wall has a thickness of about 3 (μm) microns or less. As discussed in FIG. 2, the patterned magnetic core 400 may be filled with the dielectric layer 260, in a similar manner as how the magnetic core 206 is filled with the dielectric layer 260.

As shown in FIG. 4, the patterned magnetic core 400 is configured in a spiral design. In some implementations, the patterned magnetic core 400 is configured to at least partially follow, mimic, mirror, and/or replicate the shape and/or design of the inductor 208. As will be further described below, there are several technical advantages to designing the patterned magnetic core 400 to at least partially follow, mimic, mirror, and/or replicate the shape and/or design of the inductor 208. However, it should be noted that the patterned magnetic core 400 does not need to be exactly the same shape and/or design as the inductor 208.

FIG. 4 illustrates that the patterned magnetic core 400 includes seventeen patterned magnetic layers 402-442 (e.g. a first patterned magnetic layer through a seventeenth patterned magnetic layer). The patterned magnetic layers 402-442 may be thin film magnetic (TFM) layers. The number of patterned magnetic layers 402442 may vary (e.g. be more or less than what is shown) with different implementations.

In some implementations, the patterned magnetic layer 402, the patterned magnetic layer 406, the patterned magnetic layer 412, the patterned magnetic layer 416, the patterned magnetic layer 422, the patterned magnetic layer 426, the patterned magnetic layer 432, the patterned magnetic layer 436, and the patterned magnetic layer 442 may be substantially horizontal patterned magnetic layers (e.g., top surface patterned magnetic layer, bottom surface patterned magnetic layer).

In some implementations, the patterned magnetic layer 404, the patterned magnetic layer 408, the patterned magnetic layer 414, the patterned magnetic layer 418, the patterned magnetic layer 424, the patterned magnetic layer 428, the patterned magnetic layer 434, and the patterned magnetic layer 438 are non-horizontal patterned magnetic layers (e.g., side surface patterned magnetic layer, substantially vertical patterned magnetic layers).

The patterned magnetic layers 402-442 are formed in such a manner as to form a spiral design. In some implementations, the patterned magnetic layers 402-442 (e.g., patterned magnetic layer 402) are patterned thin film magnetic layers. In some implementations, the patterned magnetic layers 402-442 may have a thickness of about 3 microns (μm) or less (e.g., about 1-2 microns (μm)).

Exemplary Inductors with Thin Film Magnetic Core

Figure 5:
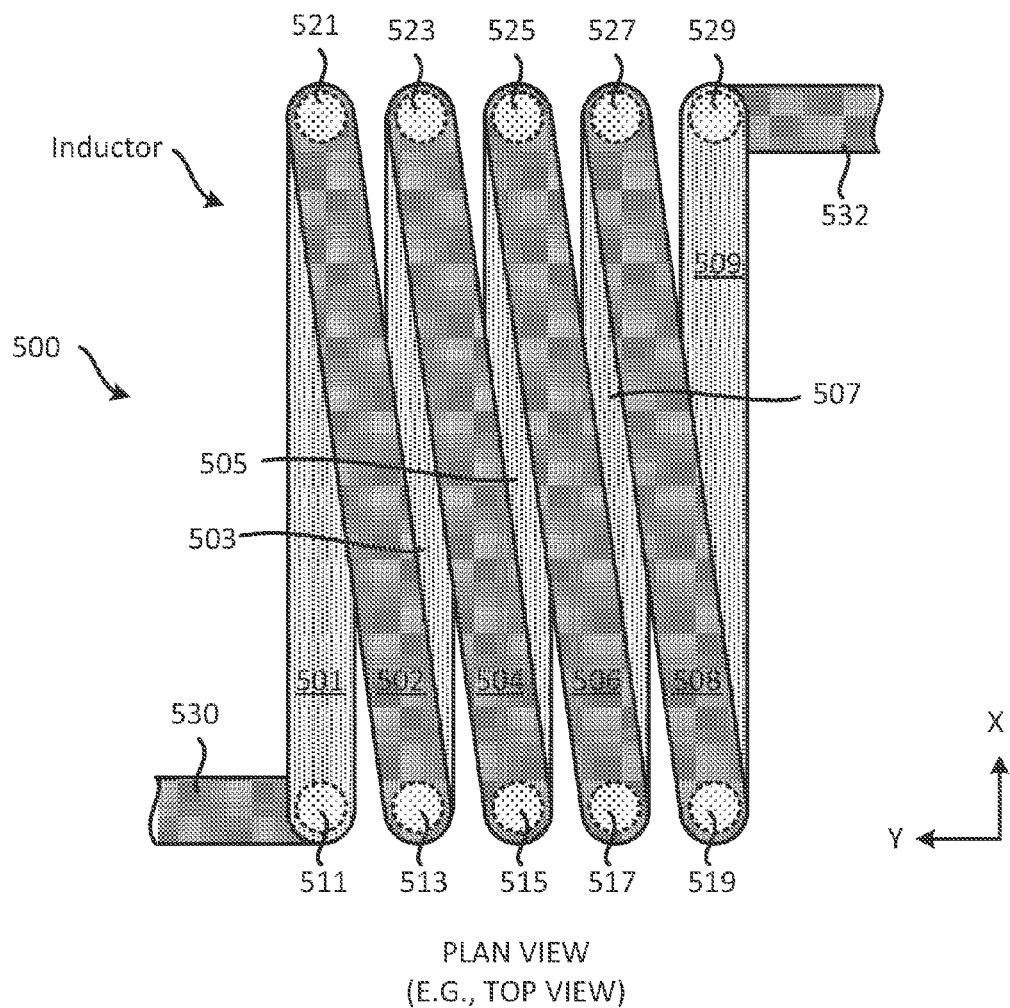
FIG. 5 illustrates a plan view (e.g., top view) of an inductor.

FIG. 5 illustrates a plan view of an inductor 500. The inductor 500 may be at least partially embedded in a substrate (e.g., package substrate). In some implementations, the inductor 500 may correspond to the inductor 208 of FIG. 2. The inductor 500 may be a solenoid inductor. The inductor 500 includes a spiral design.

The inductor 500 includes a plurality of first interconnects. More specifically, the inductor 500 includes an interconnect 501, an interconnect 502, an interconnect 503, an interconnect 504, an interconnect 505, an interconnect 506, an interconnect 507, an interconnect 508, and an interconnect 509. The interconnect 501 (e.g., trace), the interconnect 503, the interconnect 505, the interconnect 507, and the interconnect 509 are formed on or from a first metal layer of a substrate (e.g., substrate 202). For example, the interconnect 503 may correspond to the interconnect 230 of FIG. 2. The interconnect 502 (e.g., trace), the interconnect 504, the interconnect 506, and the interconnect 508 are formed on a second metal layer of a substrate (e.g., substrate 202). For example, the interconnect 502 may correspond to the interconnect 236 of FIG. 2.

The inductor 500 further includes a plurality of interconnects 511, a plurality of interconnects 513, a plurality of interconnects 515, a plurality of interconnects 517, a plurality of interconnects 519, a plurality of interconnects 521, a plurality of interconnects 523, a plurality of interconnects 525, a plurality of interconnects 527, and a plurality of interconnects 529. A plurality of interconnects may include one or more interconnects. For example, a plurality of interconnects may include one or more pads and/or one or more vias. In some implementations, the above plurality of interconnects 511, 513, 515, 517, 519, 521, 523, 525, 527, and/or 529 vertically traverse a substrate (e.g., substrate 202). For example, the plurality of interconnects 513 may collectively represent the interconnects 231-235 of FIG. 2. In another example, the plurality of interconnects 523 may collectively represent the interconnects 271-275 of FIG. 2.

As shown in FIG. 5, the plurality of interconnects 511 is coupled (e.g., electrically coupled) to the interconnect 501. The interconnect 501 is coupled (e.g., electrically coupled) to the plurality of interconnects 521. The plurality of interconnects 521 is coupled to the interconnect 502. The interconnect 502 is coupled to the plurality of interconnects 513. The plurality of interconnects 513 is coupled to the interconnect 503. The interconnect 503 is coupled to the plurality of interconnects 523. The plurality of interconnects 523 is coupled to the interconnect 504. The interconnect 504 is coupled to the plurality of interconnects 515. The plurality of interconnects 515 is coupled to the interconnect 505. The interconnect 505 is coupled to the plurality of interconnects 525. The plurality of interconnects 525 is coupled to the interconnect 506. The interconnect 506 is coupled to the plurality of interconnects 517. The plurality of interconnects 517 is coupled to the interconnect 507. The interconnect 507 is coupled to the plurality of interconnects 527. The plurality of interconnects 527 is coupled to the interconnect 508. The interconnect 508 is coupled to the plurality of interconnects 519. The plurality of interconnects 519 is coupled to the interconnect 509. The interconnect 509 is coupled to the plurality of interconnects 579.

The inductor 500 includes one or more windings. Different implementations of the inductor 500 may include different number of windings (e.g. the inductor 500 may have more or less windings than what is shown). In some implementations, the windings of the inductor 500 are defined by the interconnect 501, the interconnect 502, the interconnect 503, the interconnect 504, the interconnect 505, the interconnect 506, the interconnect 507, the interconnect 508, the interconnect 509, the plurality of interconnects 511, the plurality of interconnects 513, the plurality of interconnects 515, the plurality of interconnects 517, the plurality of interconnects 519, the plurality of interconnects 521, the plurality of interconnects 523, the plurality of interconnects 525, the plurality of interconnects 527, and the plurality of interconnects 529. For example, a first winding of the inductor 500 may be defined by the interconnect 502, the plurality of interconnects 513, the interconnect 503 and the plurality of interconnects 523. However, different implementations may define a winding of the inductor 500 differently.

FIG. 5 also illustrates an interconnect 530 and an interconnect 532. The interconnect 530 may represent a first terminal of the inductor 500. The interconnect 530 is coupled to the plurality of interconnects 511. The interconnect 532 may represent a second terminal of the inductor 500. The interconnect 532 is coupled to the plurality of interconnects 529. The plurality of interconnects 511 and 529 may be optional. In some implementations, the interconnect 530 is directly coupled to the interconnect 501. In some implementations, the interconnect 532 is directly coupled to the interconnect 509.

Figure 6:
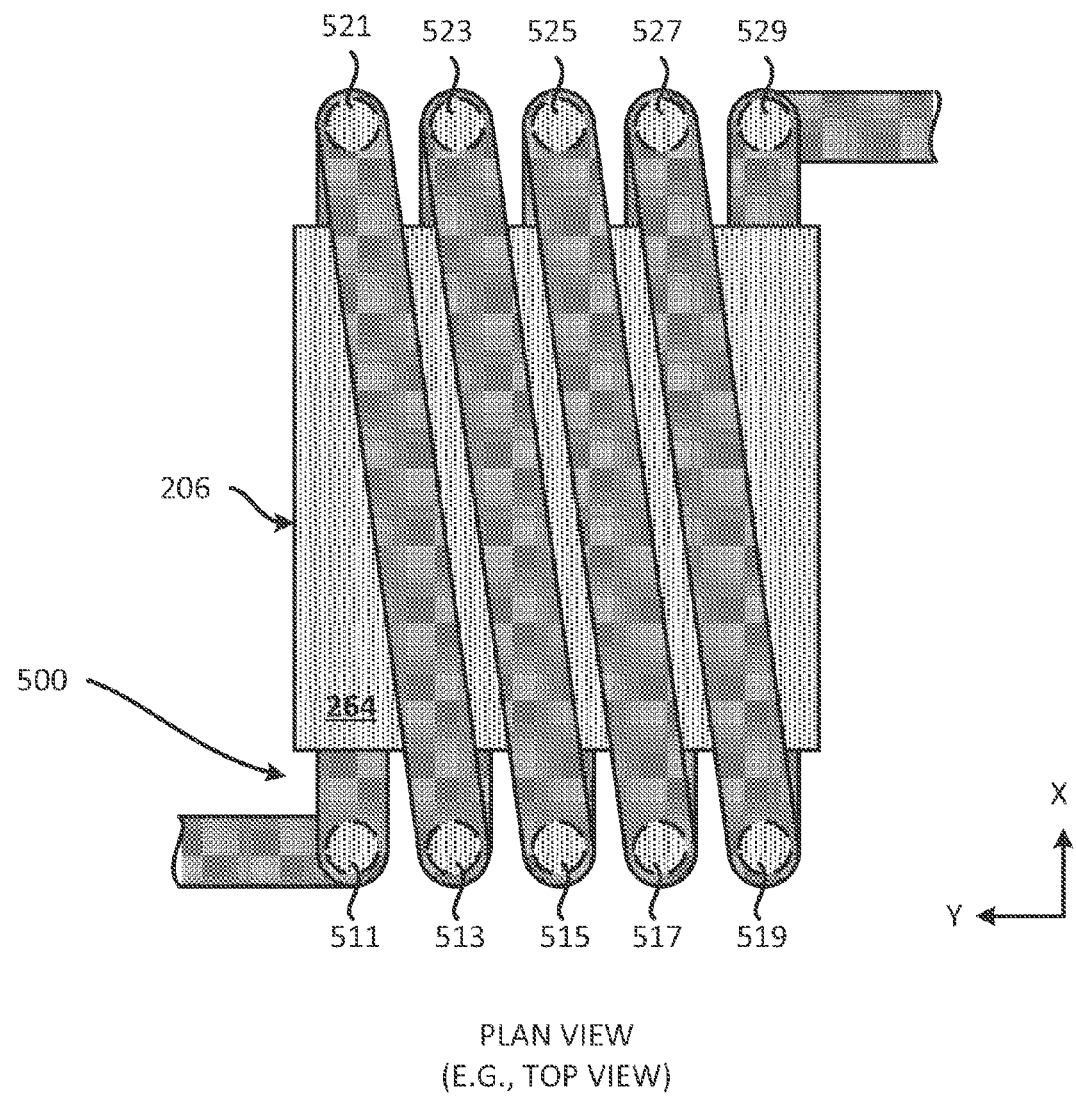
FIG. 6 illustrates a plan view (e.g., top view) of a thin film magnetic core and an inductor.

FIG. 6 illustrates the integration of the inductor 500 of FIG. 5 with the magnetic core 206 of FIG. 2 or FIG. 3 where the magnetic core 206 may be filled with the dielectric layer 260 (not shown). The inductor 500 and the magnetic core 206 may be implemented in a substrate (e.g., substrate 202). However, for the purpose of clarity, the substrate, including the dielectric layers (e.g., substrate core layer, prepeg layers) are not shown. As shown in FIG. 6, the inductor 500 is integrated with the magnetic core 206 such that the magnetic core 206 is located at least partially within the windings (e.g., plurality of interconnects) of the inductor 500.

Figure 7:
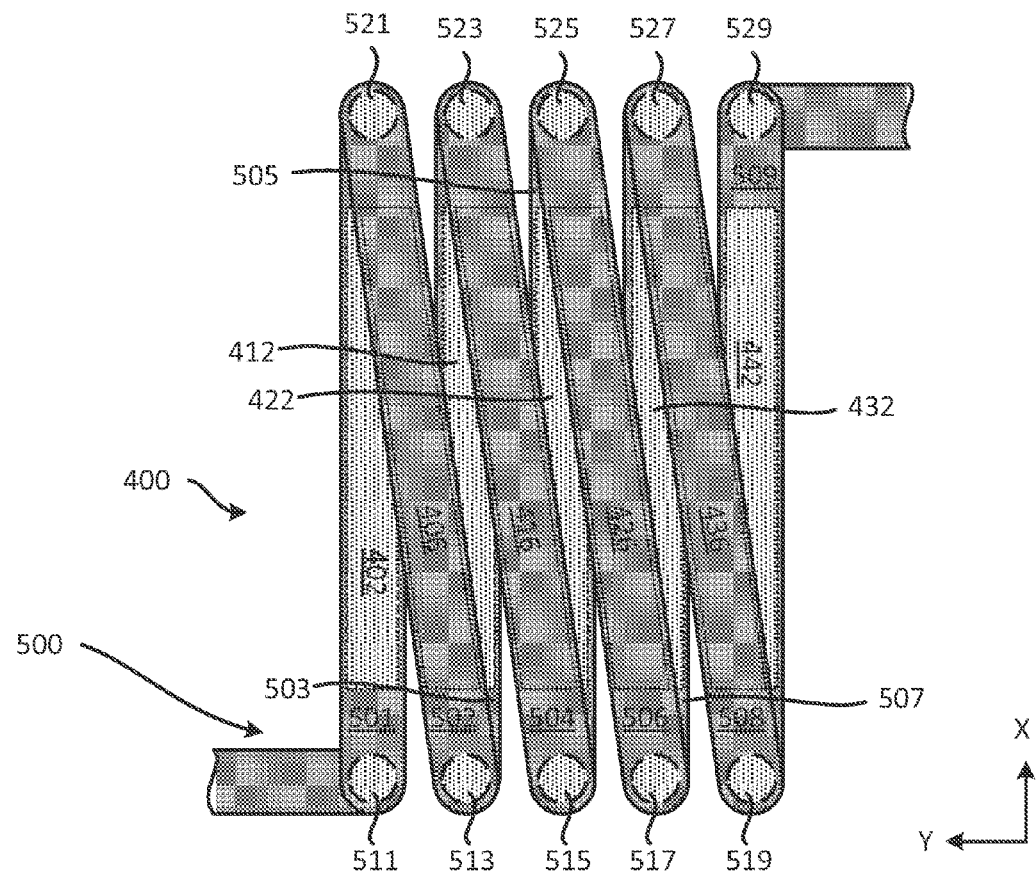
FIG. 7 illustrates a plan view (e.g., top view) of a patterned thin film magnetic core and an inductor.

FIG. 7 illustrates the integration of the inductor 500 of FIG. 5 with the patterned magnetic core 400 (which may include the dielectric layer 260 (not shown)). The inductor 500 and the patterned magnetic core 400 may be implemented in a substrate (e.g., substrate 202). However, for the purpose of clarity, the substrate, including the dielectric layers, are not shown. As shown in FIG. 7, the inductor 500 is integrated with the patterned magnetic core 400 such that the patterned magnetic core 400 is located at least partially within the windings (e.g., plurality of interconnects) of the inductor 500. Moreover, the patterned magnetic core 400 is located within the windings of the inductor 500 such the patterned magnetic layers of the patterned magnetic core 400 at least partially follow, mimics, mirrors and/or overlaps (e.g., horizontally overlaps, vertically overlaps) the windings (e.g., plurality of interconnects) of the inductor 500. For example, the patterned magnetic layers of the patterned magnetic core 400 may comprises a spiral design that at least partially follows and/or mimics the spiral design of the inductor 500.

The term "overlap" shall include to mean to at least partially overlap (e.g., at least partially vertically overlap, at least partially horizontally overlap). Thus, a component A that overlaps with a component B means that the component A at least partially overlaps with the component B, and vice versa. When a component A overlaps with a component B, the component A may be about the same, slightly-larger, slightly smaller, and/or offset from the component B. For example, a dimension (e.g., width) of the component A may be about the same, slightly larger, slightly smaller than a dimension (e.g., width) of the component B, when the component A overlaps with the component B.

More specifically, FIG. 7 illustrates that the patterned magnetic layer 402 at least partially follows and/or overlaps vertically overlaps) with the interconnect 501, the patterned magnetic layer 406 at least partially follows and/or overlaps with the interconnect 502, the patterned magnetic layer 412 at least partially follows and/or overlaps with the interconnect 503, the patterned magnetic layer 416 at least partially follows and/or overlaps with the interconnect 504, the patterned magnetic layer 422 at least partially follows and/or overlaps with the interconnect 505, the patterned magnetic layer 426 at least partially follows and/or overlaps with the interconnect 506, the patterned magnetic layer 432 at least partially follows and/or overlaps with the interconnect 507, the patterned magnetic layer 436 at least partially follows and/or overlaps with the interconnect 508, and the patterned magnetic layer 442 at least partially follows and/or overlaps with the interconnect 509.

Similarly, the side or non-horizontal patterned magnetic layers patterned magnetic layer 408) may at least partially follow and/or overlap with the interconnects (e.g., vias, pads) that vertically traverses a substrate. For example, the patterned magnetic layer 408 may at least partially follow and/or overlap (e.g., horizontally overlap) with the plurality of interconnects 513 (e.g., vias, pads). Different implementations may provide patterned magnetic layers that follow and/or overlap (e.g., vertically overlap, horizontally overlap) differently with the interconnects of the inductors. For example, the patterned magnetic layer (e.g., patterned magnetic layer 402) may have a width that is narrower, about the same, or wider than the width of the interconnect (e.g., interconnect 501). In addition, different patterned magnetic layers may have different lengths. Examples of how a patterned magnetic layer may horizontal overlap with interconnects of an inductor are described in FIGS. 17-18.

As mentioned above, the use of a magnetic core (e.g., thin film magnetic core) with an inductor provides an inductor with a better inductance (L) and better quality factor (Q), resulting in a better performing inductor. Generally speaking, the higher the inductance value and/or the quality factor value the better.

Table 1 below, illustrates some exemplary inductance (L) values and quality factor (Q) values for exemplary inductors with various configurations and/or designs.

TABLE 1

Exemplary Inductance (L) Values and Quality Factor (Q) Values

| | Inductance (L) at 100 megahertz (MHz) | Inductance (L) at 1 gigahertz (GHz) | Quality Factor (Q) at 1 gigahertz (GHz) |
|---|---|---|---|
| Inductor with Bulk Magnet | 6.7 | 2.2 | 26 |
| Inductor with Thin Film Magnetic (TFM) Layers | 6.2 | 6.2 | 83 |
| Inductor with Patterned Thin Film Magnetic (TFM) Layers | 5.7 | 5.7 | 96 |

As shown in Table 1, the use of a bulk magnet has a negative effect on the inductance and quality factor of an inductor for high frequency signals (e.g., about 1 gigahertz (GHz) or greater). While a bulk magnet helps provide better inductance at low frequency (e.g., less than 1 gigahertz (GHz)), at higher frequencies (e.g., about 1 gigahertz (GHz) or greater), the bulk magnet hurts the performance of the inductor. This is due to the fact that there is magnetic loss in the bulk magnet when the bulk magnet is placed within the inductor operating at a high frequency.

Table 1 also shows that the use of an inductor with a thin film magnetic (TFM) layer substantially improves the inductance and the quality factor at high frequency. An example of an inductor with a thin film magnetic (TFM) layer may be the inductor 300 with the magnetic core 206 of FIG. 6.

Table 1 further shows that the use of an inductor with a patterned thin film magnetic (TFM) layer substantially improves the inductance and the quality factor at high frequency. An example of an inductor with a patterned thin film magnetic (TFM) layer may be the inductor 300 with the patterned magnetic core 400 of FIG. 7. In some implementations, the patterned thin film magnetic (TFM) layer provides improved quality factor over a thin film magnetic (TFM) layer without substantially negatively impacting the inductance of the inductor. In some implementations, the thin film magnetic (TFM) layer has a thickness of about 3 microns (µm) or less. In some implementations, using a thin film magnetic (TFM) layer that has a thickness that is substantially greater than 3 microns (µm) may actually hurt the performance of the inductor (e.g., degradation of the quality factor Q and/or saturation of the inductance L). In some implementations, the thin film magnetic (TFM) layer(s) may have a thickness that is in a range of about 1-2 microns (µm). In some implementations, different portions of the magnetic core may have a thin film magnetic (TFM) layer with different thicknesses.

Thus, Table 1 illustrates how using less magnetic material actually helps in improving the inductance (L) and/or the quality factor (Q) of an inductor, which may be counter intuitive to using more magnetic material.

Different implementations may use different materials for the magnetic core and/or the magnetic layers described in the present disclosure. The magnetic layers may be a metallic material (e.g., Fe alloy, CoTaZr) or non-metallic material (e.g., Ferrite-Iron Oxide with Ni, Zn, Co, and/or Cu impurities).

Figure 8:
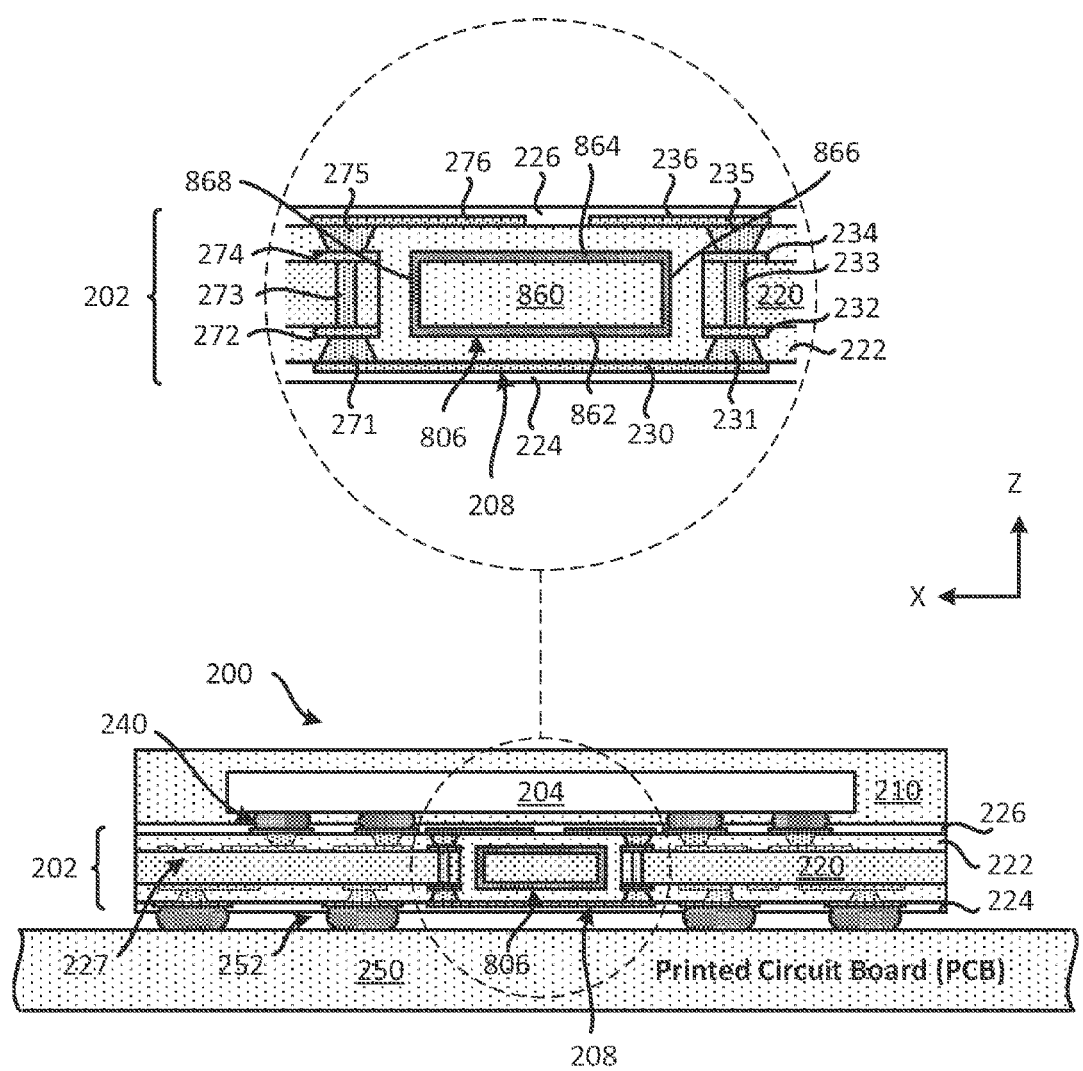
FIG. 8 illustrates a profile view of an example of an integrated circuit (IC) package that includes a magnetic core inductor embedded in a package substrate.

Exemplary Integrated Circuit Package Comprising a Thin Film Magnetic Core with an Inductor in a Package Substrate FIG. 8 illustrates an example of an integrated circuit package that includes a magnetic core with an inductor embedded in a package substrate. Specifically, FIG. 2 illustrates an example of the integrated circuit package 200 that includes the substrate 202, the die 204, a magnetic core 806, the inductor 208 and the encapsulation layer 210. The integrated circuit package 200 is mounted on a printed circuit board (PCB) 250. FIG. 8 is similar to FIG. 2, except that the magnetic core 806 is formed differently in the substrate 202.

As shown in FIG. 8, the magnetic core 806 is embedded in the substrate 802. More specifically, the magnetic core 806 is located in a cavity of the first dielectric layer 220 (e.g., substrate core layer). The cavity of the first dielectric layer 220 is filled with the second dielectric layer 222. The second dielectric layer 222 at least partially surrounds the magnetic core 806. Thus, in the example of FIG. 8, the magnetic core 806 is surrounded (e.g., completely surrounded) by the second dielectric layer 222.

The magnetic core 806 may be a thin film magnetic core. The magnetic core 806 includes a core layer 860, a first magnetic layer 866, a second magnetic layer 868, a third magnetic layer 862, and a fourth magnetic layer 864. In some implementations, the first magnetic layer 866, the second magnetic layer 868, the third magnetic layer 862, and the fourth magnetic layer 864 are thin film magnetic (TFM) layers. The first magnetic layer 866 is formed on a first surface (e.g., side surface) of the core layer 860. The second magnetic layer 868 is formed on a second surface (e.g., side surface) of the core layer 860. The third magnetic layer 862 is formed on a third surface (e.g., bottom surface) of the core layer 860, and the fourth magnetic layer 864 is formed on a fourth surface (e.g., top surface) of the core layer 860. The magnetic core 806 is at least partially surrounded by the inductor 208.

The first magnetic layer 866 may be a non-horizontal thin film magnetic (TFM) layer (e.g., vertical thin film magnetic (TFM) layer that vertically traverses a dielectric layer). The second magnetic layer 868 may be a non-horizontal thin film magnetic (TFM) layer (e.g., vertical thin film magnetic (TFM) layer that vertically traverses a dielectric layer). The third magnetic layer 862 and the fourth magnetic layer 864 may be substantially horizontal thin film magnetic (TFM) layers. The fourth magnetic layer 864 may be substantially parallel to the third magnetic layer 862.

Figure 9:
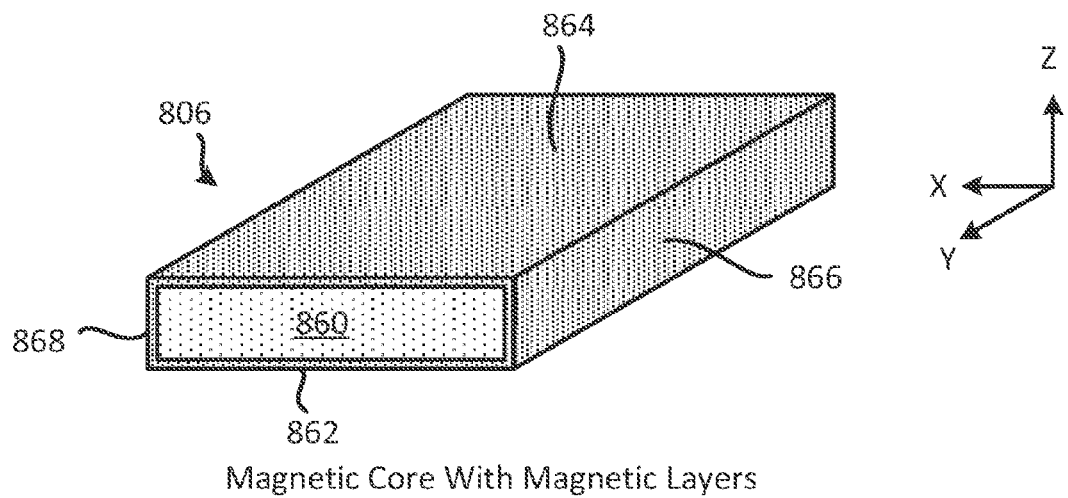
FIG. 9 illustrates a thin film inductor magnetic core.

FIG. 9 illustrates a standalone view of the magnetic core 806. As shown in FIG. 9, the magnetic core 806 includes the core layer 860, the first magnetic layer 866, the second magnetic layer 868, the third magnetic layer 862, and the fourth magnetic layer 864. In some implementations, the first magnetic layer 866, the second magnetic layer 868, the third magnetic layer 862, and the fourth magnetic layer 864 may be thin film magnetic (TFM) layers. In some implementations, the first magnetic layer 866, the second magnetic layer 868, the third magnetic layer 862, and the fourth magnetic layer 864 may have a thickness of about 3 microns (µm) or less (e.g., about 1-2 microns (µm)). The shape and/or size of the magnetic core 806 may vary with different implementations.

As mentioned above, the first magnetic layer 866 may be a non-horizontal thin film magnetic (TFM) layer (e.g., vertical thin film magnetic (TFM) layer that vertically traverses a dielectric layer), and the second magnetic layer 868 may be a non-horizontal thin film magnetic (TFM) layer (e.g., vertical thin film magnetic (TFM) layer that vertically traverses a dielectric layer).

In some implementations, the magnetic core 806 may include more or less than four magnetic layers. For example, the magnetic core 806 may only include the first magnetic layer 866 and/or the second magnetic layer 868. In some implementations, the magnetic core 806 may include a combination of the top, bottom and/or side magnetic layers.

Figure 10:
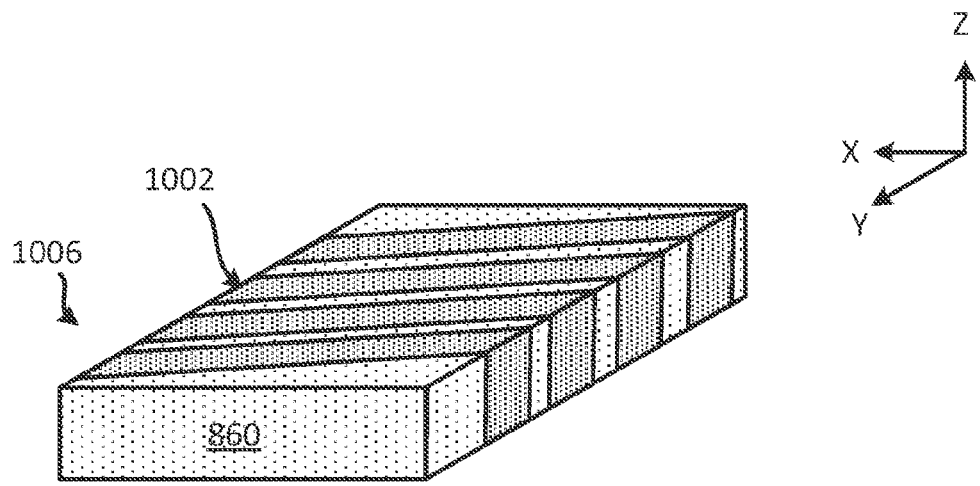
FIG. 10 illustrates a patterned thin film magnetic core.
Figure 11:
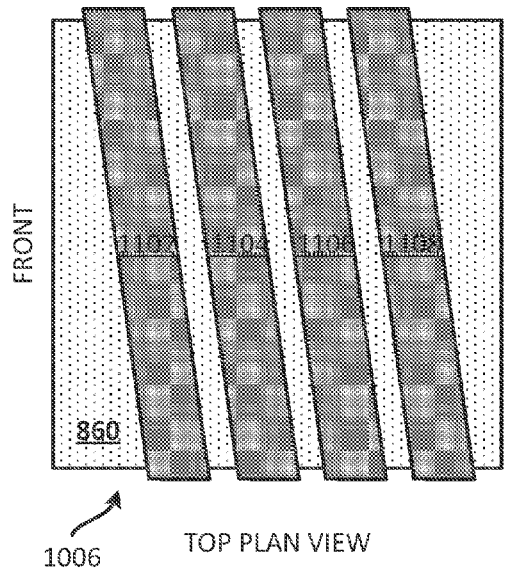
FIG. 11 illustrates a plan view (e.g., top view) of a patterned magnetic core.
Figure 13:
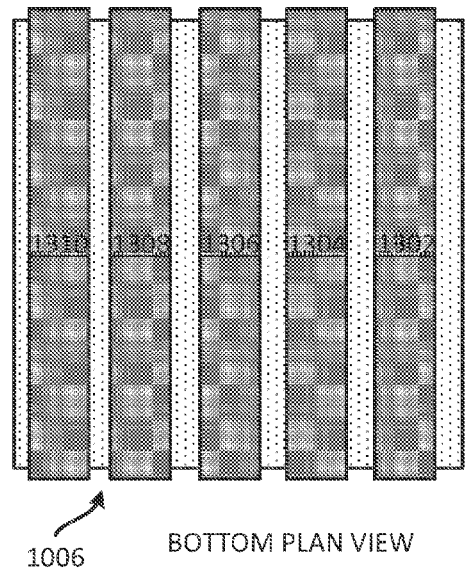
FIG. 13 illustrates another plan view (e.g., bottom view) of a patterned magnetic core.
Figure 12:
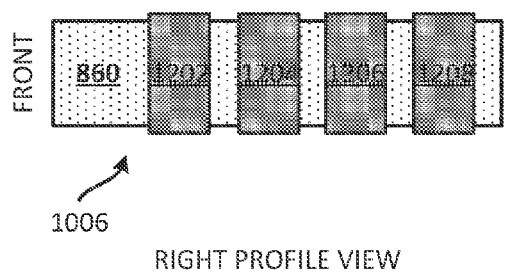
FIG. 12 illustrates a profile view of a patterned magnetic core.
Figure 14:
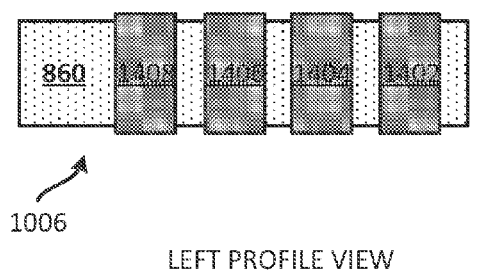
FIG. 14 illustrates another profile view of a patterned magnetic core.

FIG. 10 illustrates a standalone view of a patterned magnetic core 1006. In some implementations, the patterned magnetic core 1006 may be implemented in the substrate 202. In some implementations, the patterned magnetic core 1006 may be used instead of the magnetic core 806 in the substrate 202.

As shown in FIG. 10, the patterned magnetic core 1006 includes patterned magnetic layers 1002 that are configured in a spiral design. In some implementations, the patterned magnetic layers 1002 are configured to at least partially follow, mimic, mirror and/or replicate the shape and/or design of the inductor 208. As described above in Table 1 above, there are several technical advantages to designing the patterned magnetic core 1006 to at least partially follow, mimic, mirror and/or overlap with the shape and/or design of the inductor 208. The patterned magnetic layers 1002 include several patterned thin film magnetic layers, which are further described below in FIGS. 11-14. It should be noted that patterned magnetic core 1006 is merely an example. Different implementations may use patterned magnetic cores with different designs where the patterned magnetic layers are different than what is illustrated.

FIGS. 11-14 illustrate different views of the patterned magnetic core 1006. The patterned magnetic core 1006 includes a patterned magnetic layer 1102 (e.g., patterned thin film magnetic layer), a patterned magnetic layer 1104 (e.g. patterned thin film magnetic layer), a patterned magnetic layer 1106 (e.g., patterned thin film magnetic layer), a patterned magnetic layer 1108 (e.g., patterned thin film magnetic layer), a patterned magnetic layer 1202, a patterned magnetic layer 1204, a patterned magnetic layer 1206, an patterned magnetic layer 1208, a patterned magnetic layer 1302, a patterned magnetic layer 1304, an patterned magnetic layer 1306, a patterned magnetic layer 1308, a patterned magnetic layer 1310, a patterned magnetic layer 1402, a patterned magnetic layer 1404, a patterned magnetic layer 1406, and an patterned magnetic layer 1408.

The patterned magnetic layer 1102, the patterned magnetic layer 1104, the patterned magnetic layer 1106, the patterned magnetic layer 1108, the patterned magnetic layer 1202, the patterned magnetic layer 1204, the patterned magnetic layer 1206, the patterned magnetic layer 1208, the patterned magnetic layer 1302, the patterned magnetic layer 1304, the patterned magnetic layer 1306, the patterned magnetic layer 1308, the patterned magnetic layer 1310, the patterned magnetic layer 1402, the patterned magnetic layer 1404, the patterned magnetic layer 1406, and the patterned magnetic layer 1408 are formed in such a manner as to form a spiral design. In some implementations, the patterned magnetic layers (e.g., patterned magnetic layer 1102) are patterned thin film magnetic layers that have a thickness of about 3 microns (µm) or less (e.g., about 1-2 microns (µm)). In some implementations, the patterned magnetic layers are configured in a spiral design similar or identical to the spiral design shown in FIG. 4.

Figure 15:
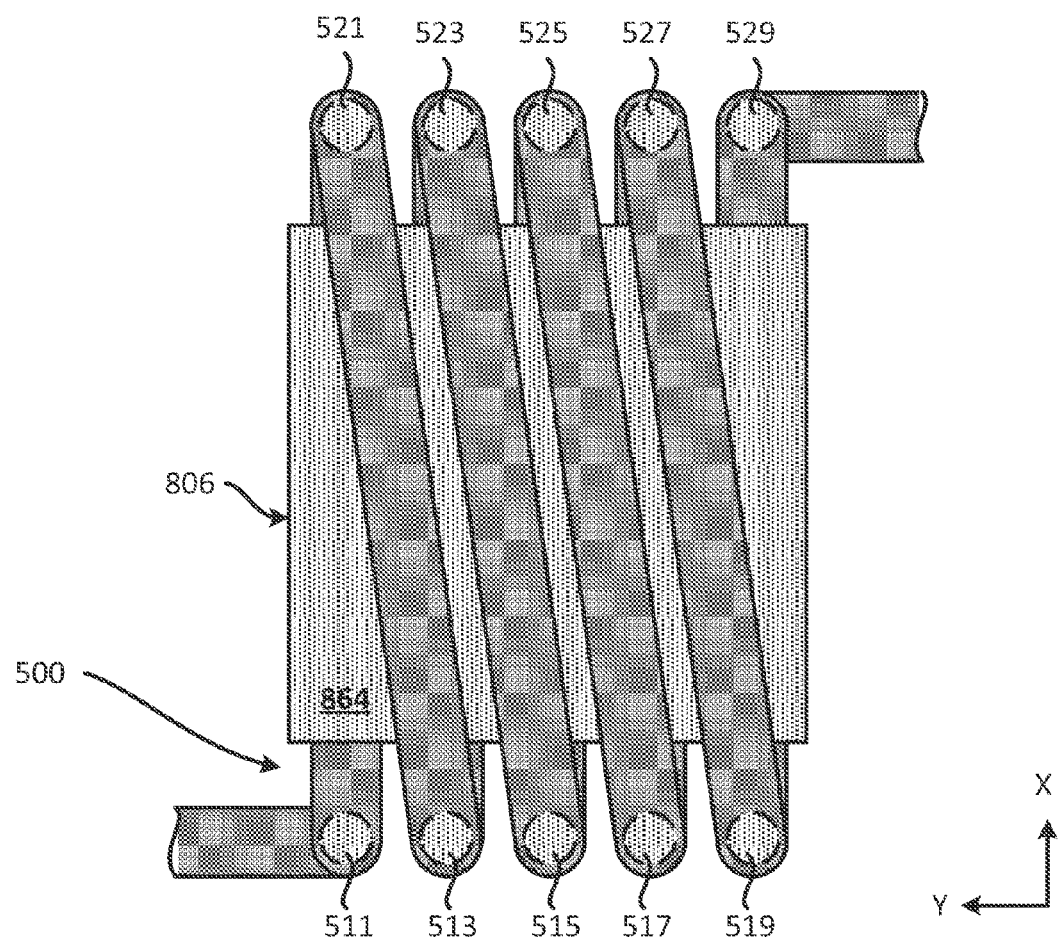
FIG. 15 illustrates a plan view (e.g., top view) of a thin film magnetic core and an inductor.

FIG. 15 illustrates the integration of the inductor 500 of FIG. 5 with the magnetic core 806. The inductor 500 and the magnetic core 806 may be implemented in a substrate (e.g., substrate 202). However, for the purpose of clarity, the substrate, including the dielectric layers (e.g., substrate core layer, prepeg layers) are not shown. As shown in FIG. 15, the inductor 500 is integrated with the magnetic core 806 such that the magnetic core 806 is located at least partially within the windings (e.g., plurality of interconnects) of the inductor 500. The magnetic core 806 includes the core layer 860 (not visible) and the magnetic layers 862, 864, 866 and 868. In some implementations, the magnetic core 806 may include more or less than four magnetic layers. For example, the magnetic core 806 may only include the first magnetic layer 866 and/or the second magnetic layer 868. In some implementations, the magnetic core 806 may include a combination of the top, bottom and/or side magnetic layers.

Figure 16:
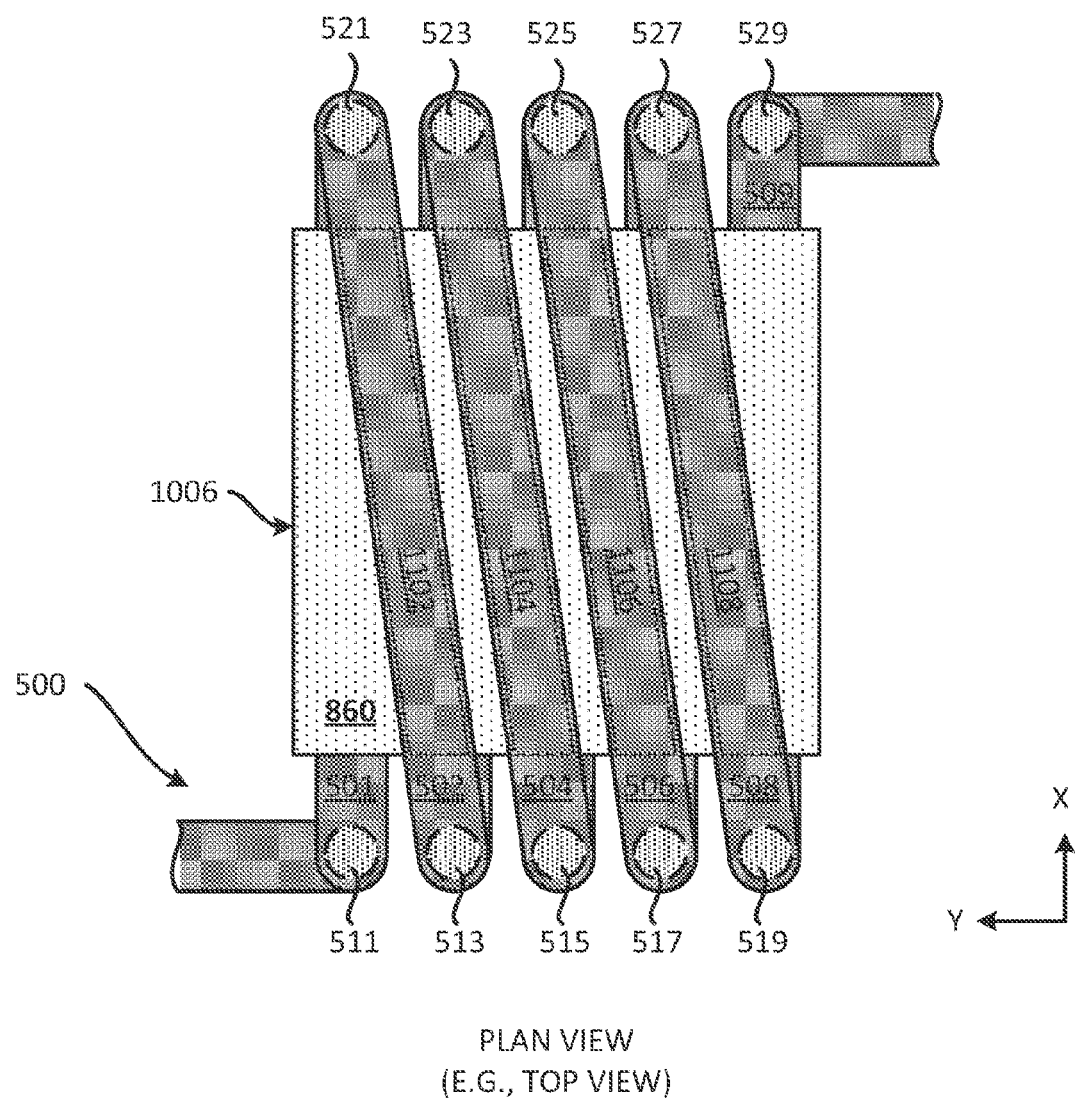
FIG. 16 illustrates a plan view (e.g., top view) of a patterned thin film magnetic core and an inductor.

FIG. 16 illustrates the integration of the inductor 500 of FIG. 5 with the patterned magnetic core 1006. The inductor 500 and the patterned magnetic core 1006 may be implemented in a substrate (e.g., substrate 202). However, for the purpose of clarity, the substrate, including the dielectric layers, are not shown. As shown in FIG. 16, the inductor 500 is integrated with the patterned magnetic core 1006 such that the patterned magnetic core 1006 is located at least partially within the windings (e.g., plurality of interconnects) of the inductor 500. Moreover, the patterned magnetic core 1006 is located within the windings of the inductor 500 such the patterned magnetic layers of the patterned magnetic core 1006 at least partially follow, mimic, mirror and/or overlap with the windings (e.g., plurality of interconnects) of the inductor 500. For example, the patterned magnetic layers of the patterned magnetic core 1006 may comprises a spiral design that at least partially follows and/or mimics the spiral design of the inductor 500.

More specifically, FIG. 16 illustrates that the patterned magnetic layer 1102 at least partially follows and/or overlaps (e.g., vertically overlaps) with the interconnect 502, the patterned magnetic layer 1104 at least partially follows and/or overlaps with the interconnect 504, the patterned magnetic layer 1106 at least partially follows and/or overlaps with the interconnect 506, and the patterned magnetic layer 1108 at least partially follows and/or overlaps with the interconnect 508.

Similarly, the patterned side or patterned non-horizontal magnetic layers (e.g., patterned magnetic layer 1208) may at least partially follow and/or overlap with the interconnects (e.g., vias, pads) that vertically traverses a substrate. For example, the patterned magnetic layer 1202 may at least partially follow and/or overlap (e.g., horizontally overlap) with the plurality of interconnects 513 (e.g., vias, pads). Different implementations may provide patterned magnetic layers that overlap (e.g., vertically overlap, horizontally overlap) differently with the interconnects of the inductors. For example, the patterned magnetic layer (e.g., patterned magnetic layer 1102) may have a width that is narrower, about the same, or wider than the width of the interconnect (e.g., interconnect 502). In addition, different patterned magnetic layers may have different lengths.

Figure 17:
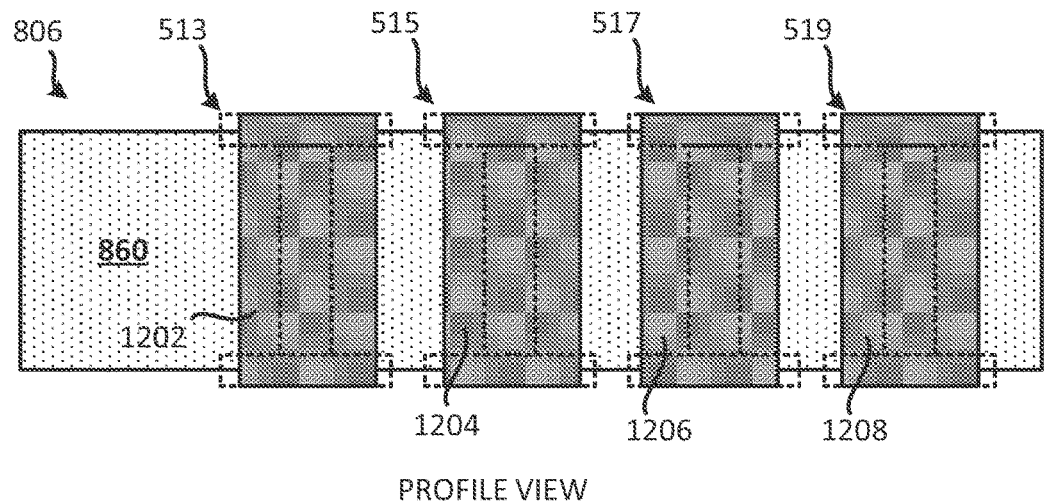
FIG. 17 illustrates a profile view of a magnetic layer of a magnetic core overlapping interconnects of an inductor.
Figure 18:
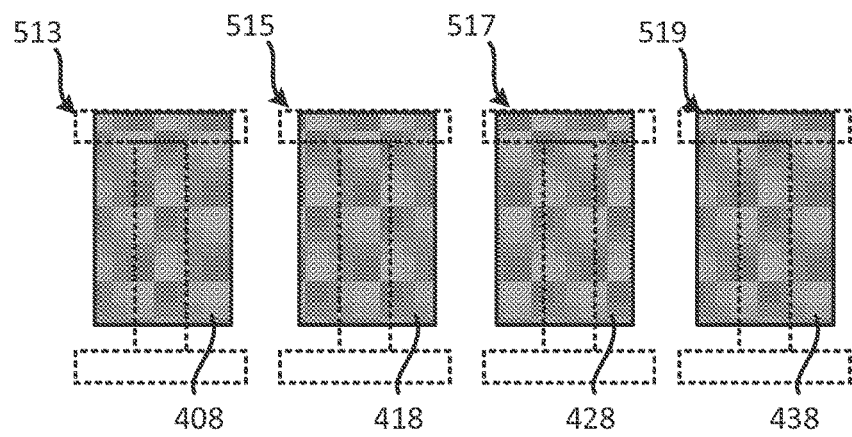
FIG. 18 illustrates a profile view of a magnetic layer of a magnetic core overlapping interconnects of an inductor.

FIGS. 17-18 illustrate how patterned magnetic layers (e.g., patterned side magnetic layers) may horizontally or laterally overlap with windings (e.g., interconnects) of an inductor. FIG. 17 illustrates how patterned magnetic layers of the magnetic core 806 may be arranged or aligned with interconnects of the inductor 500. For example, FIG. 17 illustrates that the patterned magnetic layer 1202 is aligned (e.g., laterally overlaps) with the plurality of interconnects 513 (e.g., pads, vias), the patterned magnetic layer 1204 is at least partially aligned (e.g., laterally overlaps) with the plurality of interconnects 515 (e.g., pads, vias), the patterned magnetic layer 1206 is at least partially aligned (e.g., laterally overlaps) with the plurality of interconnects 517 (e.g., pads, vias), and the patterned magnetic layer 1208 is at least partially aligned (e.g., laterally overlaps) with the plurality of interconnects 519 (e.g., pads, vias). As an example, the plurality of interconnects 513 may collectively represent some or all of the interconnects 231-235 of FIG. 8. For instance, the plurality of interconnects 513 may represent the interconnects 232-234 of FIG. 8.

FIG. 18 illustrates how other patterned magnetic layers may be arranged or aligned with interconnects of the inductor 500. FIG. 18 is similar to FIG. 17, except that the interconnects of the inductor 500 are aligned differently to the magnetic layers of a magnetic core. As previously described above in FIGS. 2 and 8, the position or location of the magnetic core and/or magnetic layer in a package substrate may be different. In some implementations, this difference in alignment between the inductor 500 and the magnetic layer may be due to how the magnetic core (e.g., patterned magnetic core 400) and magnetic layers are fabricated in the package substrate, which will be further described below in FIGS. 19 and 20.

FIG. 18 illustrates that the patterned magnetic layer 408 is aligned (e.g., laterally overlaps) with the plurality of interconnects 513 (e.g., pads, vias), the patterned magnetic layer 418 is at least partially aligned (e.g., laterally overlaps) with the plurality of interconnects 515 (e.g., pads, vias), the patterned magnetic layer 428 is at least partially aligned (e.g., laterally overlaps) with the plurality of interconnects 517 (e.g., pads, vias), and the patterned magnetic layer 438 is at least partially aligned (e.g., laterally overlaps) with the plurality of interconnects 519 (e.g., pads, vias). As an example, the plurality of interconnects 513 may collectively represent some or all of the interconnects 231-235 of FIG. 2. For instance, the plurality of interconnects 513 may represent the interconnects 232-234 of FIG. 2.

FIG. 18 illustrates that the magnetic layers do not need to be perfectly aligned with the windings of the inductor. It is noted that the patterned magnetic layers may have the same profile or have a similar profile as the plurality of interconnects to which it is aligned in some implementations.

Figure 19A:
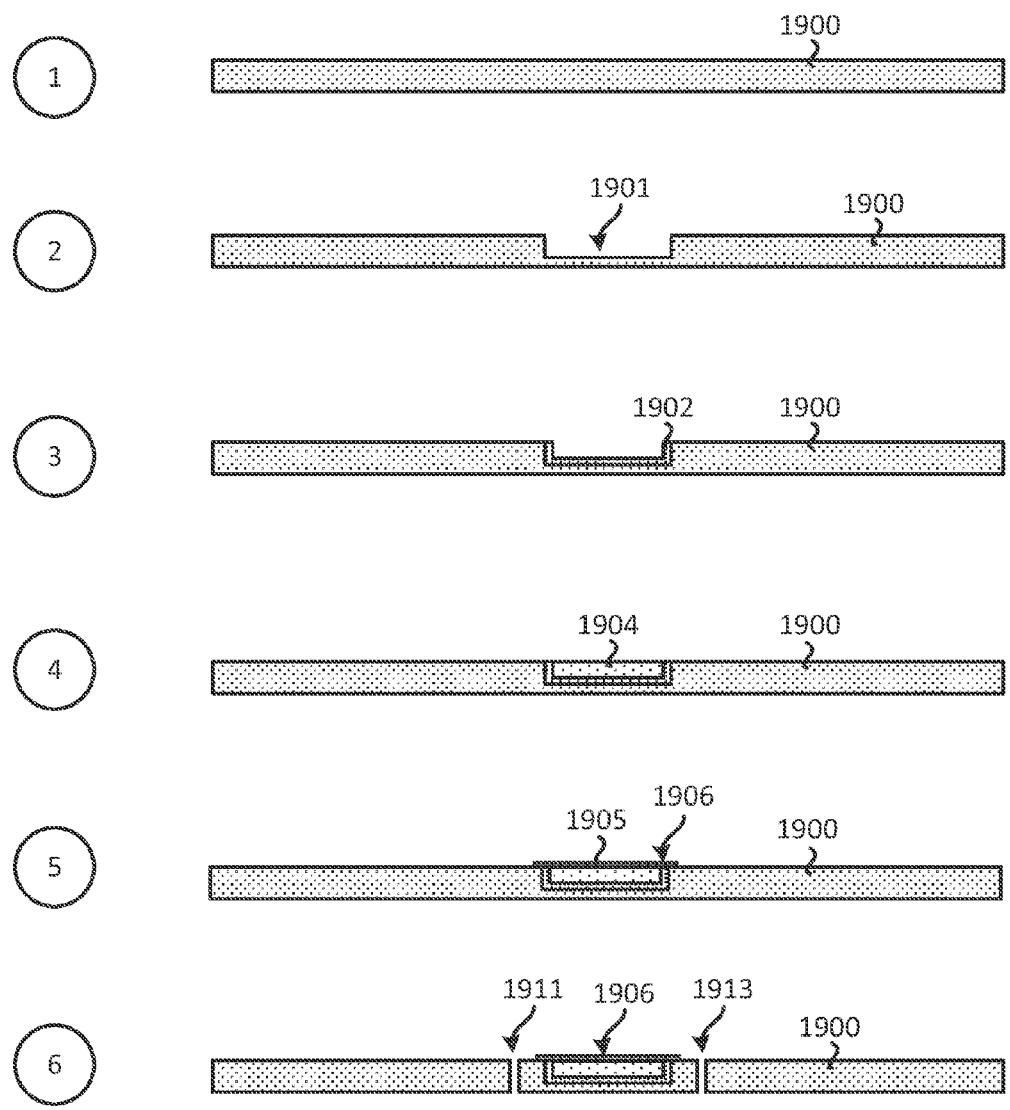
FIG. 19 (which includes FIGS. 19A-19C) illustrates an exemplary sequence for providing/fabricating an integrated circuit (IC) package that includes a magnetic core with an inductor embedded in a package substrate.
Figure 19B:
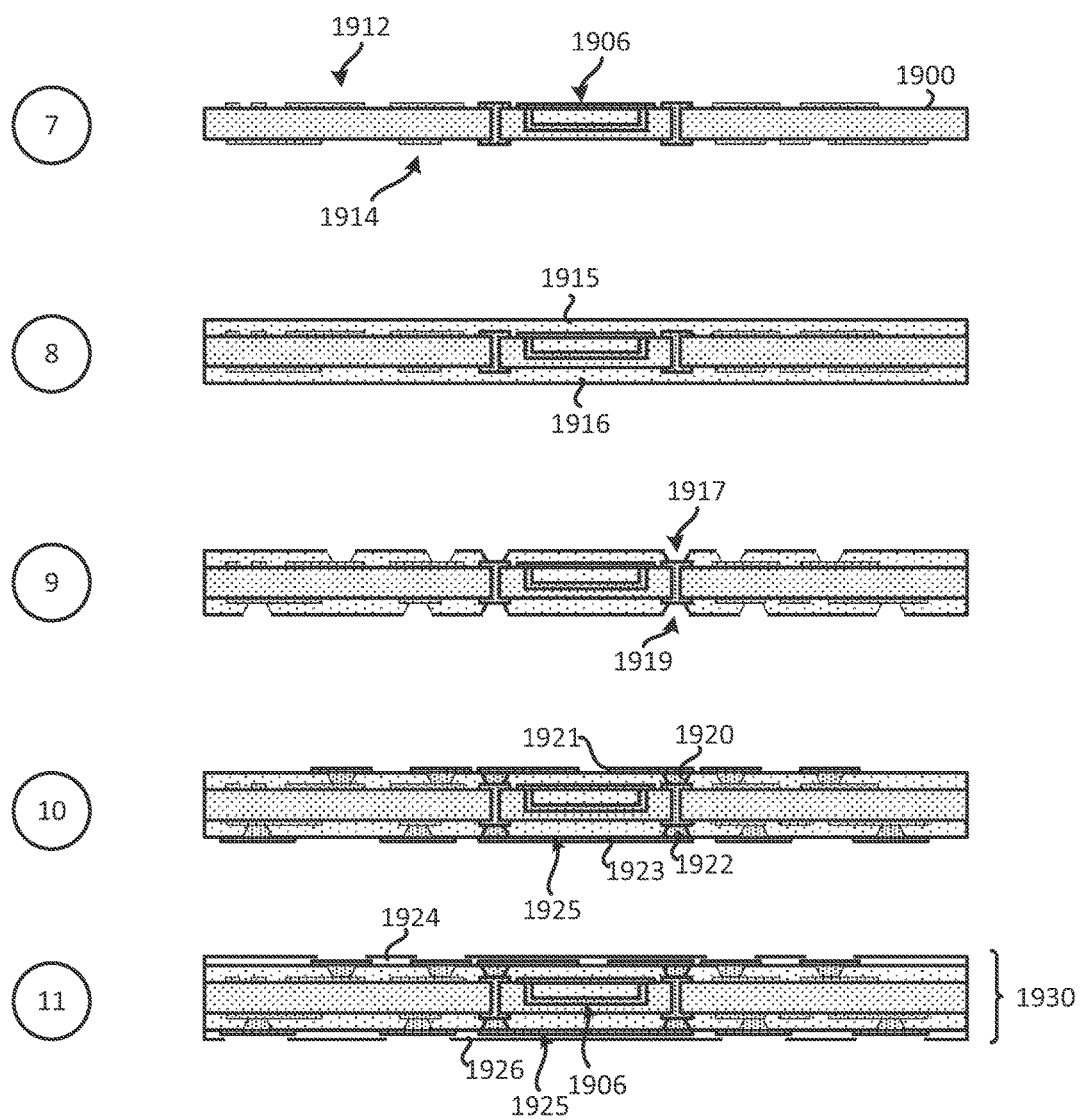
Figure 19C:
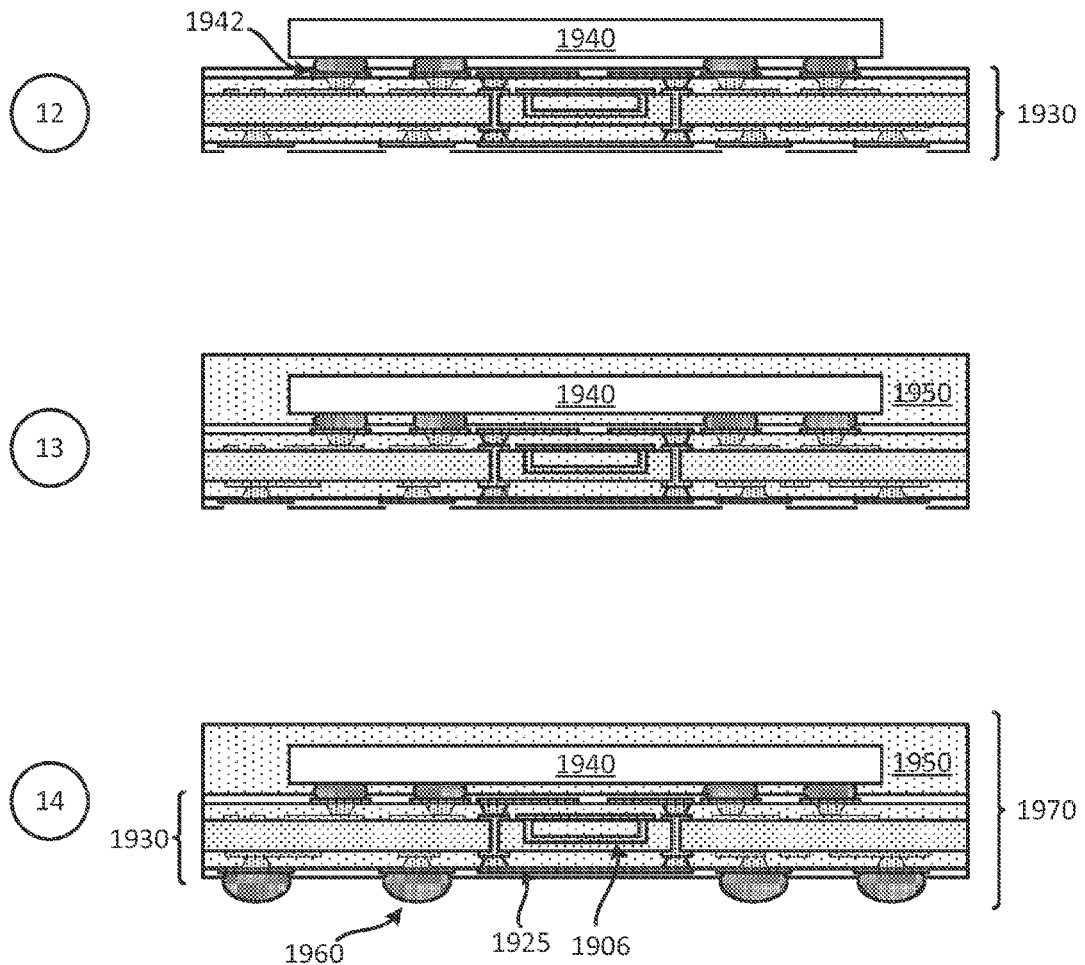

Exemplary Sequence for Providing/Fabricating an Integrated Circuit Package Comprising a Thin Film Magnetic Core with an Inductor in a Package Substrate In some implementations, providing/fabricating an integrated circuit package that includes a magnetic core with an inductor embedded in a package substrate includes several processes. FIG. 19 (which includes FIGS. 19A-19C) illustrates an exemplary sequence for providing/fabricating an integrated circuit package that includes a magnetic core with an inductor embedded in a package substrate. In some implementations, the sequence of FIGS. 19A-19C may be used to provide/fabricate the integrated circuit package 200 of FIG. 2 and/or other integrated circuit packages described in the present disclosure.

It should be noted that the sequence of FIGS. 19A-19C may combine one or more stages in order to simplify and/or clarify the sequence for providing/fabricating an integrated circuit package that includes a magnetic core with an inductor. In some implementations, the order of the processes may be changed or modified.

Stage 1, as shown in FIG. 19A, illustrates a state after a dielectric layer 1900 is provided. The dielectric layer 1900 may be a substrate core layer. In some implementations, the dielectric layer 1900 may be a glass material. In some implementations, the dielectric layer 1900 is provided by a supplier. In some implementations, the dielectric layer 1900 is fabricated (e.g., formed).

Stage 2 illustrates a state after a first cavity 1901 is formed in the dielectric layer 1900. Different implementations may form the first cavity 1901 differently. In some implementations, a laser process may be used to form the cavity. In some implementations, a photo etching process may be used to form the first cavity 1901.

Stage 3 illustrates a state after a first magnetic layer 1902 is formed in the first cavity 1901. The first magnetic layer 1902 may be a thin film magnetic (TFM) layer. The first magnetic layer 1902 may have a thickness of about 3 (μm) microns or less. The first magnetic layer 1902 is formed on a bottom portion of the first cavity 1901 and the side portion of the first cavity 1901. In some implementations, the first magnetic layer 1902 may include several patterned magnetic layers (e.g., as described in FIG. 4). The first magnetic layer 1902 may include a substantially horizontal thin film magnetic (TFM) layer and/or a non-horizontal thin film magnetic (TFM) layer (e.g., vertical thin film magnetic (TFM) layer). In some implementations, the first magnetic layer 1902 may form on the surface of the dielectric layer 1900.

In some implementations, after stage 3, an optional passivation layer (e.g., Silicon nitride, Silicon oxide) (not shown) may be formed over the first magnetic layer 1902. The passivation layer is not shown in FIG. 19A. However, the passivation layer may be a thin film layer.

Stage 4 illustrates a state after a dielectric layer 1904 is formed over the first magnetic layer 1902. The dielectric layer 1904 may be a prepeg layer.

Stage 5 illustrates a state after a second magnetic layer 1905 is formed on the dielectric layer 1904. The second magnetic layer 1905 may be a thin film magnetic (TFM) layer (e.g., substantially horizontal thin film magnetic (TFM) layer). The second magnetic layer 1905 may have a thickness of about 3 (μm) microns or less. The second magnetic layer 1905 may include several patterned magnetic layers (e.g., as described in FIG. 4). In some implementations, the first magnetic layer 1902 and the second magnetic layer 1905 may form a magnetic core 1906. The magnetic core 1906 may be similar or identical to the magnetic core 206 or the patterned magnetic core 400, as described in FIGS. 2-4. In some implementations, the magnetic core 1906 may include the first magnetic layer 1902, the dielectric layer 1904, and the second magnetic layer 1905. The magnetic core 1906 may be similar to the magnetic core 206 or the patterned magnetic core 400.

Stage 6 illustrates a state after a second cavity 1911 and a third cavity 1913 are formed in the dielectric layer 1900. Different implementations may form the second cavity 1911 and the third cavity 1913 differently. In some implementations, a laser process may be used to form the cavities. In some implementations, a photo etching process may be used to form the cavities.

Stage 7, as shown in FIG. 19B, illustrates a state after a first metal layer 1912 and a second metal layer 1914 are formed on the dielectric layer 1900. The forming and patterning of the first metal layer 1912 and the second metal layer 1914 may form interconnects (e.g., traces, vias, pads). Some of the interconnects formed by the first metal layer 1912 and/or the second metal layer 1914 may form portions of an inductor. Different implementations may use different processes for forming the first metal layer 1912 and the second metal layer 1914. A photo-lithography process (e.g., photo-etching process) may be use to pattern the metal layers. Patterning methods could include modified semi-additive or semi-additive patterning processes (SAP).

Stage 8 illustrates a state after a first dielectric layer 1915 is formed on a first surface (e.g., top surface) of the dielectric layer 1900 and the magnetic core 1906. Stage 8 also illustrates a state after a second dielectric layer 1916 is formed on a second surface (e.g., bottom surface) of the dielectric layer 1900. The first dielectric layer 1915 and the second dielectric layer 1916 may be prepeg layers. Stage 8 illustrates that the magnetic core 1906 is at least partially surrounded by the dielectric layer 1900 and at least partially surrounded by the first dielectric layer 1915.

Stage 9 illustrates a state after a cavity 1917 is formed in the first dielectric layer 1915, and a cavity 1919 is formed in the second dielectric layer 1916. A photo-etching process may be used to form the cavity. Stage 9 involves via cavity formation and patterning for the second and third dielectric layers. Patterning methods could include modified semi-additive or semi-additive patterning processes (SAP).

Stage 10 illustrates a state after an interconnect 1920 (e.g., via) and an interconnect 1921 (e.g., trace) are formed in/on the first dielectric layer 1915, and an interconnect 1922 (e.g., via) and an interconnect 1923 trace) are formed in/on the second dielectric layer 1916. The interconnect 1920 is coupled to the interconnect 1921. The interconnect 1922 is coupled to the interconnect 1923. The interconnects 1920, 1921, 1922 and 1923 may define a portion (e.g., winding) of an inductor 1925.

Stage 11 illustrates a state after a first solder resist layer 1924 is formed on the first dielectric layer 1915, and a second solder resist layer 1926 is formed on the second dielectric layer 1916. Stage 11 illustrates a substrate 1930 that includes the dielectric layer 1900, the magnetic core 1906, the first dielectric layer 1915, the second dielectric layer 1916, several interconnects (e.g., interconnect 1920), the first solder resist layer 1924, and the second solder resist layer 1926. The substrate 1930 may be a package substrate. The substrate 1930 may be similar to the substrate 202 of FIG. 2.

Stage 12, as shown in FIG. 19C, illustrates a state after a die 1940 is coupled (e.g., mounted) to the substrate 1930 through a plurality of solder balls 1942. The die 1940 may be coupled to the substrate 1930 differently.

Stage 13 illustrates a state after an encapsulation layer 1950 is formed on the substrate 1930 and the die 1940. In some implementations, the encapsulation layer 1950 comprises a mold and/or epoxy fill. In some implementations, the encapsulation layer 1950 is optional.

Stage 14 illustrates a state after a plurality of solder balls 1960 is coupled to the substrate 1930. In some implementations, stage 15 illustrates an integrated circuit package 1970 that includes the substrate 1930, the magnetic core 1906, an inductor 1925 (e.g., defined by interconnects 1920, 1921, 1922 and 1923), the die 1940, and the encapsulation layer 1950. In some implementations, the inductor comprises a solenoid inductor. In some implementations, the integrated circuit package 1970 is similar to the integrated circuit package 200 of FIG. 2.

FIGS. 19A-19C illustrate a very cost effective process of fabricating an integrated circuit package that includes an inductor with a magnetic core that is embedded in a package substrate.

Figure 20A:
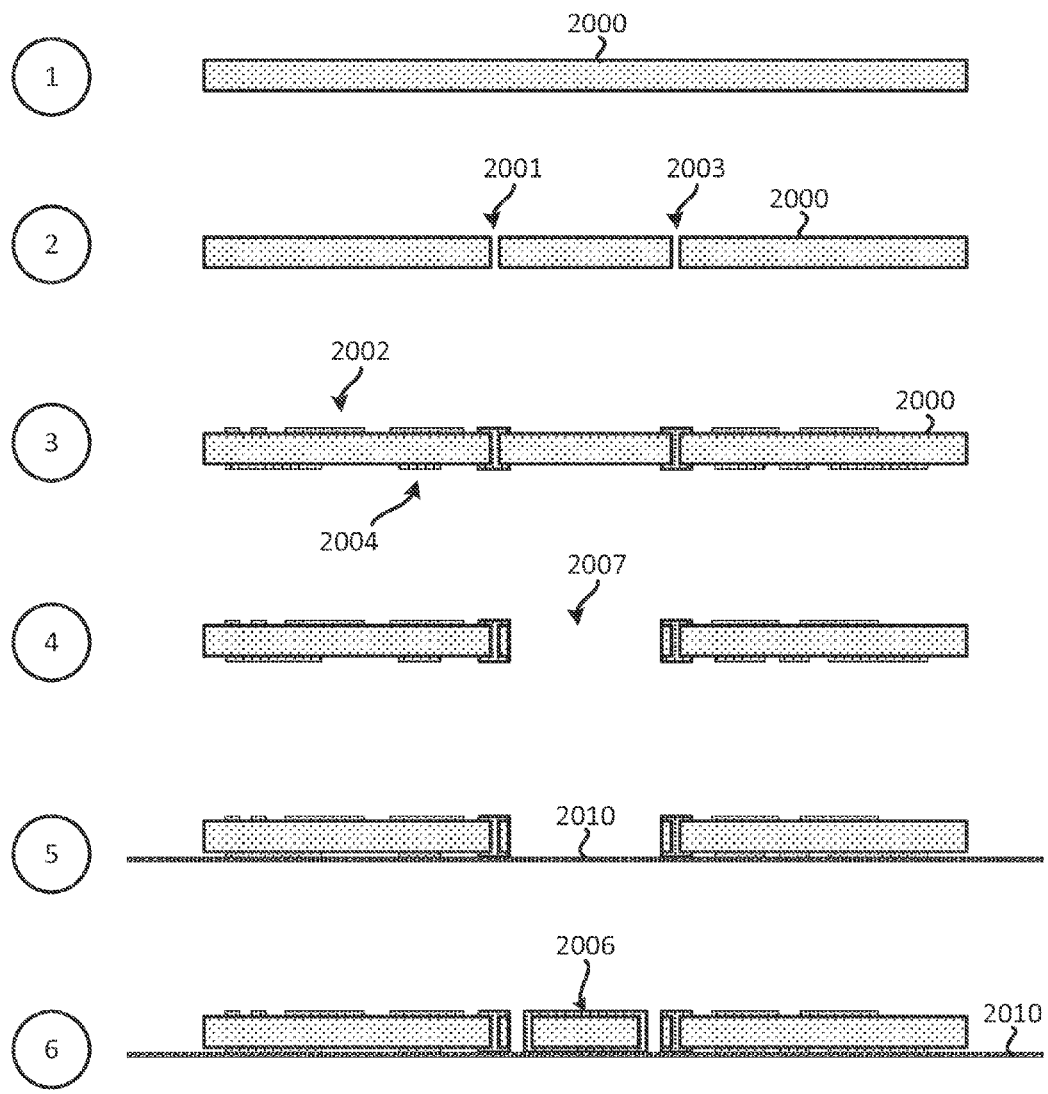
FIG. 20 (which includes FIGS. 20A-20C) illustrates an exemplary sequence for providing/fabricating an integrated circuit (IC) package that includes a magnetic core with an inductor embedded in a package substrate.
Figure 20B:
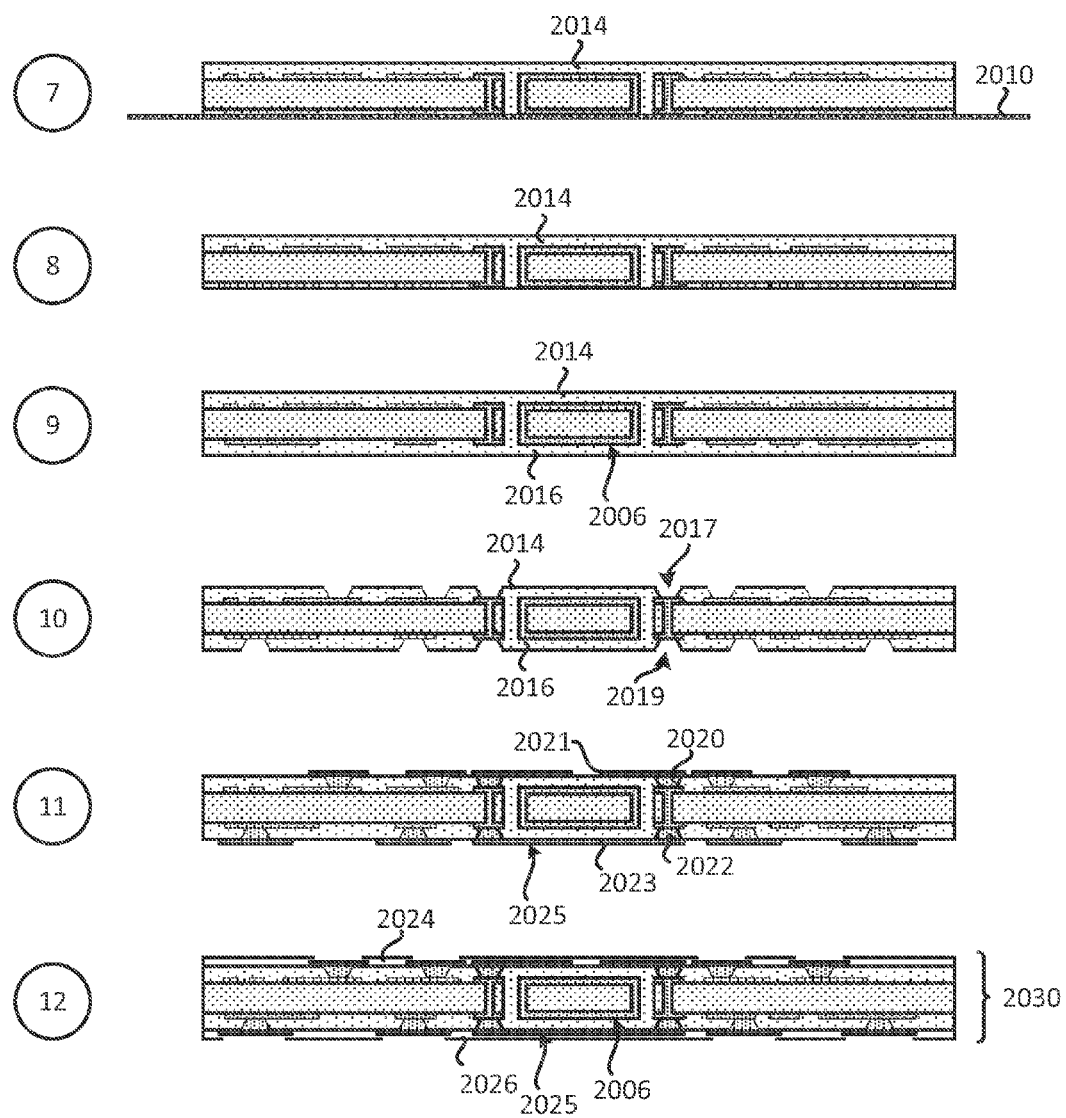
Figure 20C:
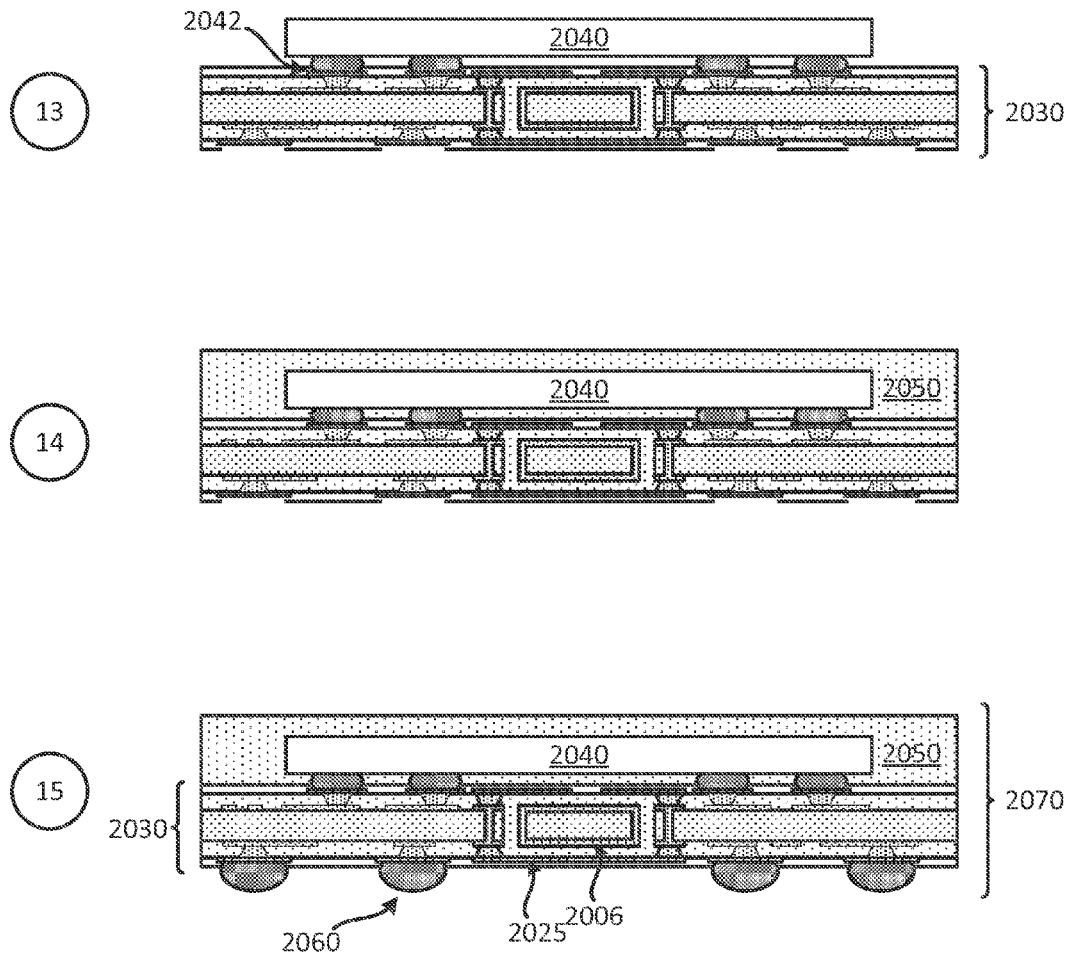

Exemplary Sequence for Providing/Fabricating an Integrated Circuit Package Comprising a Magnetic Core Inductor Embedded in a Package Substrate In some implementations, providing/fabricating an integrated circuit package that includes a magnetic core with an inductor embedded in a package substrate includes several processes. FIG. 20 (which includes FIGS. 20A-20C) illustrates an exemplary sequence for providing/fabricating an integrated circuit package that includes a magnetic core with an inductor embedded in a package substrate. In some implementations, the sequence of FIGS. 20A-20C may be used to provide/fabricate the integrated circuit package 800 of FIG. 8 and/or other integrated circuit packages described in the present disclosure.

It should be noted that the sequence of FIGS. 20A-20C may combine one or more stages in order to simplify and/or clarify the sequence for providing/fabricating an integrated circuit package that includes a magnetic core with an inductor. In some implementations, the order of the processes may be changed or modified.

Stage 1, as shown in FIG. 20A, illustrates a state after a dielectric layer 2000 is provided. The dielectric layer 2000 may be a substrate core layer. In some implementations, the dielectric layer 2000 is provided by a supplier. In some implementations, the dielectric layer 2000 is fabricated (e.g., formed).

Stage 2 illustrates a state after a first cavity 2001 and a second cavity 2003 are formed in the dielectric layer 2000. Different implementations may form the first cavity 2001 and the second cavity 2003 differently. In some implementations, a laser process may be used to form the cavities.

Stage 3 illustrates a state after a first metal layer 2002 and a second metal layer 2004 are formed on the dielectric layer 2000. The forming and patterning of the first metal layer 2002 and the second metal layer 2004 may form interconnects that define portions (e.g., windings) of an inductor. Different implementations may use different processes for forming the first metal layer 2002 and the second metal layer 2004. A photo-lithography process (e.g., photo-etching process) may be use to pattern the metal layers. Patterning methods could include modified semi-additive or semi-additive patterning processes (SAP).

Stage 4 illustrates a state after a cavity 2007 is formed in the dielectric layer 2000. In some implementations, a laser is used to form (e.g., remove) portions of the dielectric layer 2000.

Stage 5 illustrates a state after the dielectric layer 2000 is coupled to a carrier 2010.

Stage 6 illustrates a state after a magnetic core 2006 is positioned in the cavity 2007 of the dielectric layer 2000 (e.g., substrate core layer). The magnetic core 2006 may be any of the magnetic cores (e.g., magnetic core 806, patterned magnetic core 1006) described in the present disclosure. The magnetic core 2006 is positioned on the carrier 2010. The magnetic core 2006 may include a core layer (e.g., core layer 860) and one or more magnetic layers (e.g., non-horizontal thin film magnetic (TFM) layer).

Stage 7, as shown in FIG. 20B, illustrates a state after a second dielectric layer 2014 is formed on a first surface of the dielectric layer 2000, the cavity 2007 and the magnetic core 2006. The second dielectric layer 2014 may be prepeg layer.

Stage 8 illustrates a state after the carrier 2010 is decoupled (e.g., detached) from the dielectric layer 2000.

Stage 9 illustrates a state after a third dielectric layer 2016 is formed on a second side of the dielectric layer 2000. In some implementations, the third dielectric layer 2016 and the second dielectric layer 2014 may be the same dielectric layer. Stage 9 illustrates a state that shows the magnetic core 2006 being at least partially surrounded by the second dielectric layer 2014 and at least partially surrounded by the third dielectric layer 2016.

Stage 10 illustrates a state after a cavity 2017 is formed in the second dielectric layer 2014, and a cavity 2019 is formed in the third dielectric layer 2016. A photo-etching process may be used to form the cavity. Stage 10 involves via cavity formation and patterning for the second and third dielectric layers. Patterning methods could include modified semi-additive or semi-additive patterning processes (SAP).

Stage 11 illustrates a state after an interconnect 2020 (e.g., via) and an interconnect 2021 (e.g., trace) are formed in/on the dielectric layer 2015, and an interconnect 2022 (e.g., via) and an interconnect 2023 (e.g., trace) are formed in/on the third dielectric layer 2016. The interconnect 2020 is coupled to the interconnect 2021. The interconnect 2022 is coupled to the interconnect 2023. The interconnects 2020, 2021, 2022 and 2023 may define a portion (e.g., winding) of an inductor 2025.

Stage 12 illustrates a state after a first solder resist layer 2024 is formed on the second dielectric layer 2014, and a second solder resist layer 2026 is formed on the third dielectric layer 2016. Stage 12 illustrates a substrate 2030 that includes the dielectric layer 2000, the magnetic core 2006, the second dielectric layer 2014, the third dielectric layer 2016, several interconnects (e.g., interconnect 2020), the first solder resist layer 2024, and the second solder resist layer 2026. The substrate 2030 may be a package substrate.

Stage 13, as shown in FIG. 20C, illustrates a state after a die 2040 is coupled (e.g., mounted) to the substrate 2030 through a plurality of solder balls 2042. The die 2040 may be coupled to the substrate 2030 differently.

Stage 14 illustrates a state after an encapsulation layer 2050 is formed on the substrate 2030 and the die 2040. In some implementations, the encapsulation layer 2050 comprises a mold and/or epoxy fill. In some implementations, the encapsulation layer 2050 is optional.

Stage 15 illustrates a state after a plurality of solder balls 2060 is coupled to the substrate 2030. In some implementations, stage 15 illustrates an integrated circuit package 2070 that includes the substrate 2030, the magnetic core 2006, an inductor 2025 (e.g., defined by interconnects 2020, 2021, 2022 and 2023), the die 2040, and the encapsulation layer 2050. In some implementations, the inductor is a solenoid inductor. In some implementations, the integrated circuit package 2070 is similar to the integrated circuit package 800 of FIG. 8.

Figure 21:
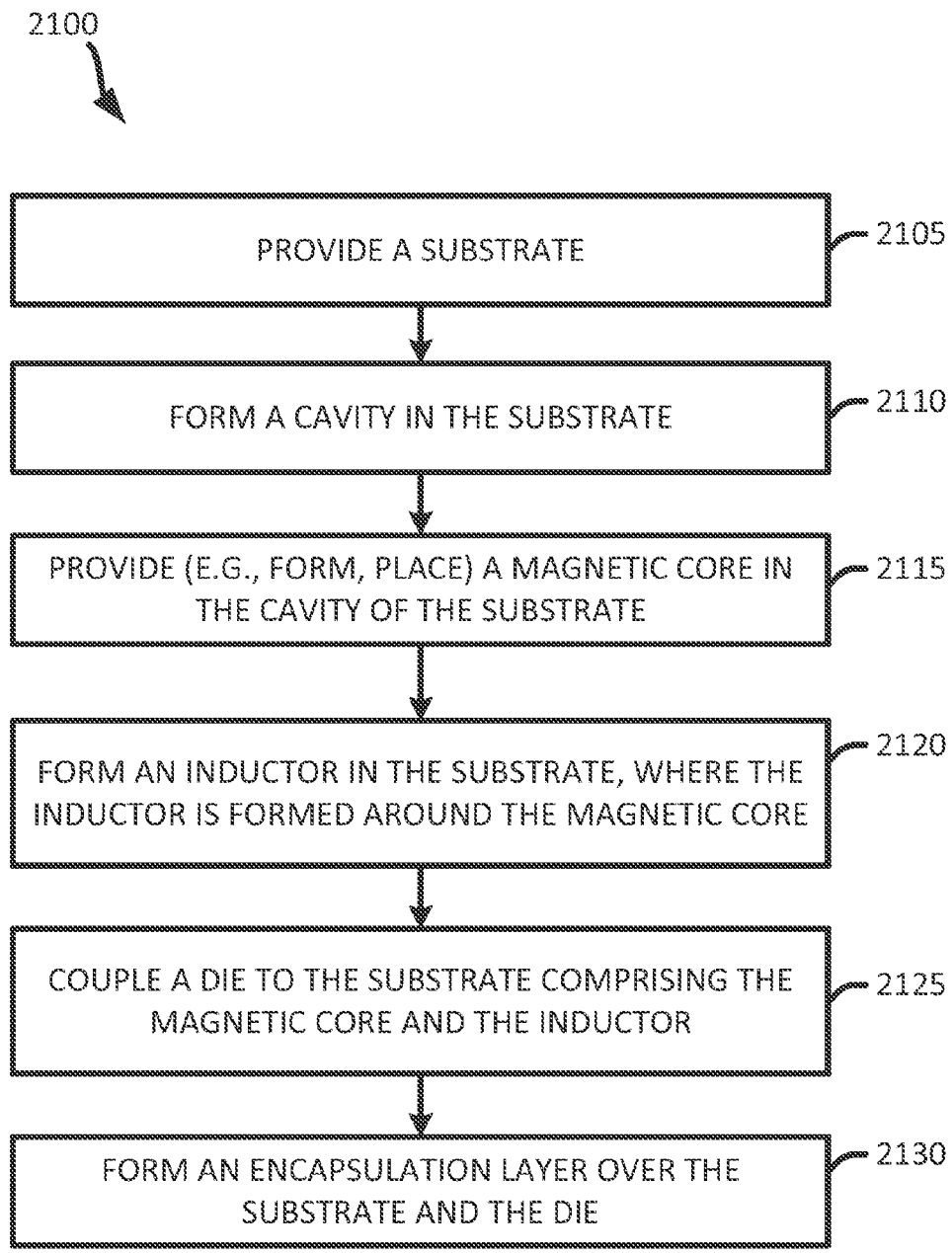
FIG. 21 illustrates an exemplary flow diagram of a method for providing/fabricating an integrated circuit (IC) package that includes a magnetic core with an inductor embedded in a package substrate.

Exemplary Method for Providing/Fabricating an Integrated Circuit Package Comprising a Magnetic Core Inductor Embedded in a Package Substrate FIG. 21 illustrates an exemplary flow diagram of a method 2100 for providing/fabricating an integrated circuit package that includes a magnetic core with an inductor embedded in a package substrate. In some implementations, the method of FIG. 21 may be used to provide/fabricate the integrated circuit package of FIGS. 2, 8 and/or other integrated circuit packages in the present disclosure.

It should be noted that the flow diagram of FIG. 21 may combine one or more steps and/or processes in order to simplify author clarify the method for providing an integrated circuit package. In some implementations, the order of the processes may be changed or modified.

The method provides (at 2105) a substrate. In some implementations, the substrate is provided by a supplier. In some implementations, the substrate is fabricated (e.g., formed). The substrate may be a package substrate. The substrate may be a glass material. The substrate may include a dielectric layer (e.g., substrate core layer) and metal layers on the dielectric layer (e.g., dielectric layer 1900, 2000).

The method forms (at 2110) a cavity (e.g., first cavity 1901) in the dielectric layer (e.g., substrate core layer, glass) of the substrate.

The method provides (at 2115) a magnetic core in the cavity of the dielectric layer of the substrate. An example of a magnetic core is described in FIGS. 2 and/or 8. In some implementations, providing a magnetic core includes forming magnetic layers in the cavity of the dielectric layer. Stages 3 and 5 of FIG. 19A illustrates an example of forming magnetic layers on the dielectric layer. In some implementations, providing the magnetic core includes placing a magnetic core (that includes a core layer and at least one magnetic layer) in the cavity. Stage 6 of FIG. 20A illustrates an example of placing a magnetic core in a cavity of a substrate.

The method forms (at 2120) an inductor (e.g., inductor 500) in the substrate such that the inductor is formed at least partially around the magnetic core. The inductor may be a solenoid inductor. Stages 6-10 of FIGS. 19A-19B illustrate an example of forming an inductor in a substrate.

The method couples (at 2125) a die (e.g., die 1940) to the substrate that includes the magnetic core and the inductor. The die may be coupled to the substrate through a plurality of solder balls (e.g., solder balls 1942). Some implementations may couple the die to the substrate differently. Stage 13 of FIG. 20C illustrates an example of a die coupled to a substrate.

The method forms (at 2130) an encapsulation layer (e.g., encapsulation layer 1950) on the substrate and the die. The encapsulation layer may be a mold and/or an epoxy fill. Stage 14 of FIG. 20C illustrates an example of an encapsulation layer being formed on the substrate and the die. Once the encapsulation is formed, the method may couple a plurality of solder balls to the substrate. The plurality of solder balls may be used to couple the substrate to a printed circuit board (PCB).

Exemplary Inductors With a Magnetic Core

Figure 22:
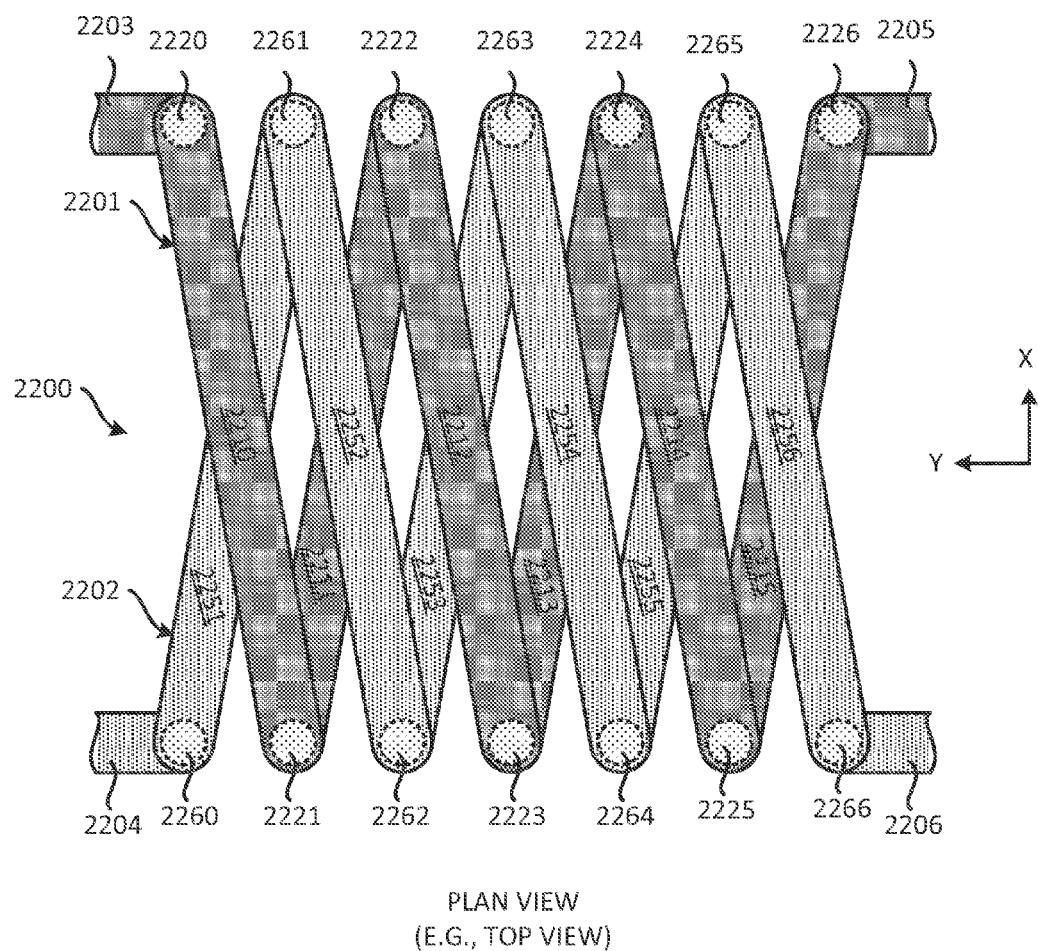
FIG. 22 illustrates a plan view (e.g., top view) of a coupled inductor.

FIG. 22 illustrates a plan view (e.g., top view) of a coupled inductor 2200. The coupled inductor 2200 includes a first inductor 2201 and a second inductor 2202. The coupled inductor 2200 may be at least partially embedded in a substrate (e.g., package substrate) in a similar manner as described in FIGS. 2 and/or 8 above. The first inductor 2201 is interleaved with the second inductor 2202. That is, the windings (e.g., plurality of first interconnects) of the first inductor 2201 are interleaved with the windings (e.g., plurality of second interconnects) of the second inductor 2202.

The first inductor 2201 includes an interconnect 2210, an interconnect 2211, an interconnect 2212, an interconnect 2213, an interconnect 2214, and an interconnect 2215. The interconnect 2210 (e.g., trace), the interconnect 2312, and the interconnect 2314 are formed on a first metal layer of a substrate (e.g., substrate 202). The interconnect 2211, the interconnect 2213, and the interconnect 2215 are formed in a second metal layer of a substrate (e.g., substrate 202).

The first inductor 2201 further includes a plurality of interconnects 2220, a plurality of interconnects 2221, a plurality of interconnects 2222, a plurality of interconnects 2223, a plurality of interconnects 2224, a plurality of interconnects 2225, and a plurality of interconnects 2226. A plurality of interconnects may include one or more interconnects. For example, a plurality of interconnects may include one or more pads and/or one or more vias, in some implementations, the above plurality of interconnects 2220-2226 vertically traverse a substrate (e.g., substrate 202). For example, the plurality of interconnects 2221 may collectively represent the interconnects 231-235 of FIG. 2.

As shown in FIG. 22, the plurality of interconnects 2220 is coupled (e.g., electrically coupled) to the interconnect 2210. The interconnect 2210 is coupled (e.g., electrically coupled) to the plurality of interconnects 2221. The plurality of interconnects 2221 is coupled to the interconnect 2211. The interconnect 2211 is coupled to the plurality of interconnects 2222. The plurality of interconnects 2222 is coupled to the interconnect 2212. The interconnect 2212 is coupled to the plurality of interconnects 2223. The plurality of interconnects 2223 is coupled to the interconnect 2213.

The interconnect 2213 is coupled to the plurality of interconnects 2224. The plurality of interconnects 2224 is coupled to the interconnect 2214. The interconnect 2214 is coupled to the plurality of interconnects 2225. The plurality of interconnects 2225 is coupled to the interconnect 2215. The interconnect 2215 is coupled to the plurality of interconnects 2226.

The first inductor 2201 includes an interconnect 2203 and an interconnect 2205. The interconnect 2203 may be a first terminal of the first inductor 2201. The interconnect 2205 may be a second terminal of the first inductor 2201. The interconnect 2203 is coupled to the plurality of interconnects 2220. The interconnect 2205 is coupled to the plurality of interconnects 2226. The plurality of interconnects 2220 and 2226 may be optional. In some implementations, the interconnect 2203 is directly coupled to the interconnect 2210. In some implementations, the interconnect 2205 is directly coupled to the interconnect 2215.

The second inductor 2202 includes an interconnect 2251, an interconnect 2252, an interconnect 2253, an interconnect 2254, an interconnect 2255, and an interconnect 2256. The interconnect 2251 (e.g., trace), the interconnect 2253, and the interconnect 2255 are formed on a second metal layer of a substrate (e.g. substrate 202). The interconnect 2252, the interconnect 2254, and the interconnect 2256 are formed in a first metal layer of a substrate (e.g., substrate 202).

The second inductor 2202 further includes a plurality of interconnects 2260, a plurality of interconnects 2261, a plurality of interconnects 2262, a plurality of interconnects 2263, a plurality of interconnects 2264, a plurality of interconnects 2265, and a plurality of interconnects 2266. A plurality of interconnects may include one or more interconnects. For example, a plurality of interconnects may include one or more pads and/or one or more vias. In some implementations, the above plurality of interconnects 2260-2266 vertically traverse a substrate (e.g., substrate 202). For example, the plurality of interconnects 2261 may collectively represent the interconnects 231-235 of FIG. 2.

As shown in FIG. 22, the plurality of interconnects 2260 is coupled (e.g., electrically coupled) to the interconnect 2251. The interconnect 2251 is coupled (e.g., electrically coupled) to the plurality of interconnects 2261. The plurality of interconnects 2261 is coupled to the interconnect 2252. The interconnect 2252 is coupled to the plurality of interconnects 2262. The plurality of interconnects 2262 is coupled to the interconnect 2253. The interconnect 2253 is coupled to the plurality of interconnects 2263. The plurality of interconnects 2263 is coupled to the interconnect 2254. The interconnect 2254 is coupled to the plurality of interconnects 2264. The plurality of interconnects 2264 is coupled to the interconnect 2255. The interconnect 2255 is coupled to the plurality of interconnects 2265. The plurality of interconnects 2265 is coupled to the interconnect 2256. The interconnect 2256 is coupled to the plurality of interconnects 2266.

The second inductor 2202 includes an interconnect 2204 and an interconnect 2206. The interconnect 2204 may be a first terminal of the second inductor 2202. The interconnect 2206 may be a second terminal of the second inductor 2202. The interconnect 2204 is coupled to the plurality of interconnects 2260. The interconnect 2206 is coupled to the plurality of interconnects 2266. The plurality of interconnects 2260 and 2266 may be optional. In some implementations, the interconnect 2204 is directly coupled to the interconnect 2251. In some implementations, the interconnect 2206 is directly coupled to the interconnect 2256.

Figure 23:
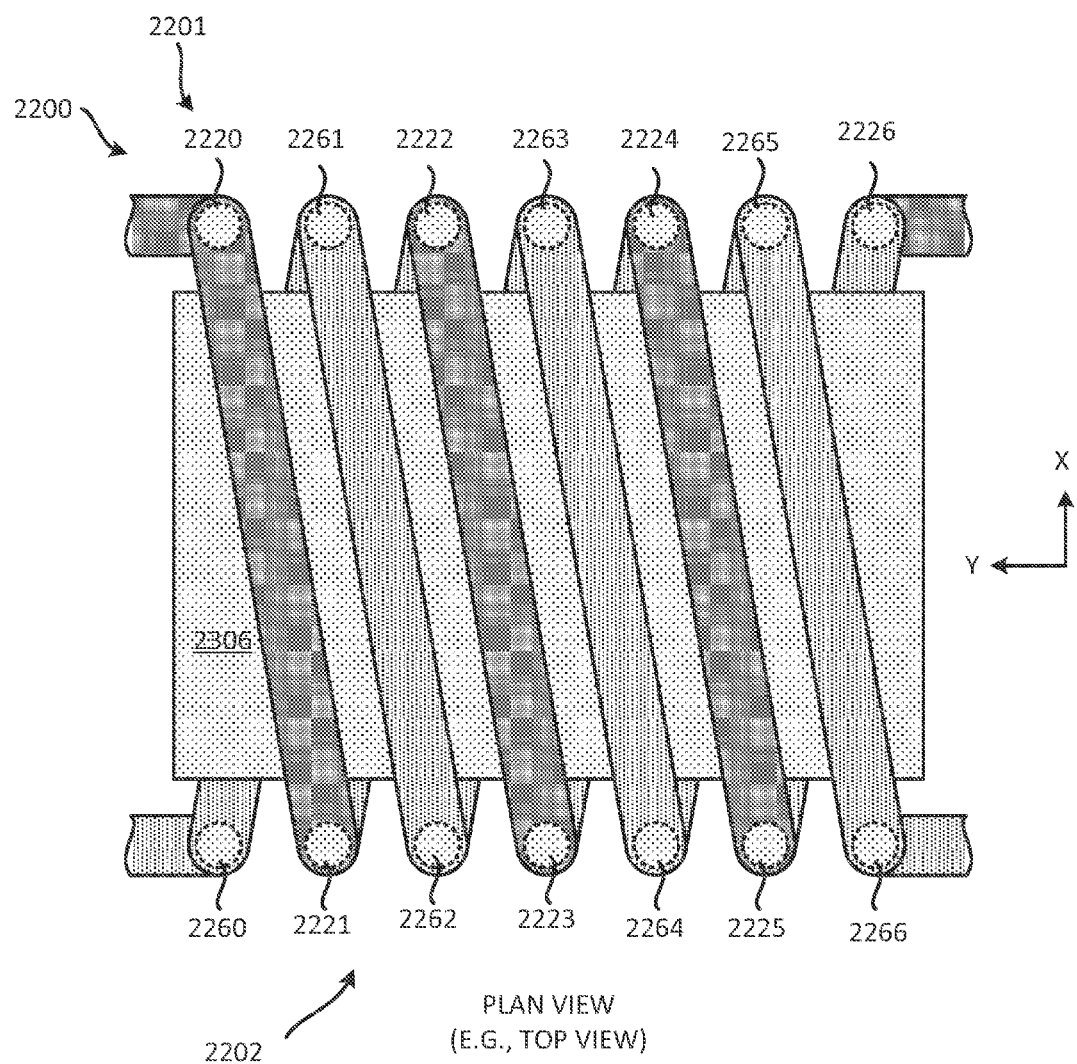
FIG. 23 illustrates a plan view (e.g., top view) of a magnetic core with coupled inductors.

FIG. 23 illustrates the integration of the coupled inductor 2200 of FIG. 22 with a magnetic core 2306. The magnetic core 2306 may be any of the magnetic core (e.g., magnetic core 806, patterned magnetic core 1006) described in the present disclosure. The magnetic core 2306 may include a dielectric layer (not shown), a core layer (not shown), and/or one or more magnetic layers (e.g., thin film magnetic (TFM) layers). As mentioned above the coupled inductor 2200 includes the first inductor 2201 and the second inductor 2202. The coupled inductor 2200 and the magnetic core 2306 may be implemented in a substrate (e.g., substrate 202). However, for the purpose of clarity, the substrate, including the dielectric layers (e.g., substrate core layer, prepeg layers) are not shown.

As shown in FIG. 23, the coupled inductor 2200 is integrated with the magnetic core 2306 such that the magnetic core 2306 is located at least partially within the windings (e.g., plurality of interconnects) of the coupled inductor 2200.

Exemplary Electronic Devices

Figure 24:
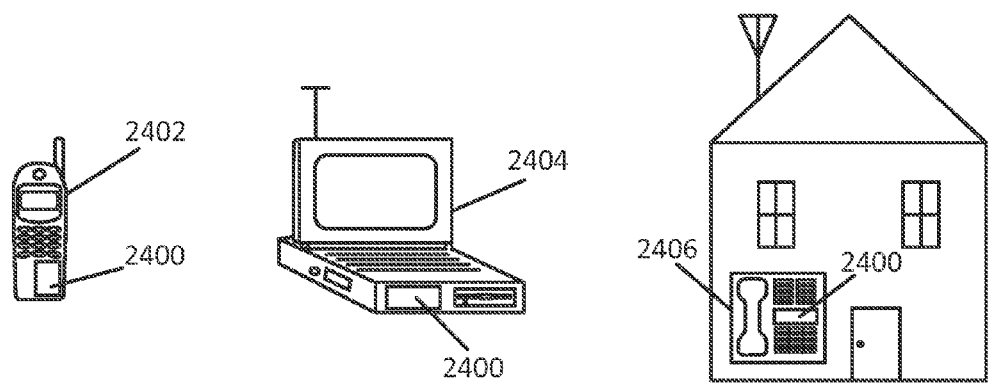
FIG. 24 illustrates various electronic devices that may include an integrated circuit (IC) package, a semiconductor device, a die, an integrated circuit (IC), a substrate and/or a PCB described herein.

FIG. 24 illustrates various electronic devices that may be integrated with any of the aforementioned integrated device, semiconductor device, integrated circuit, die, interposer, package or package-on-package (PoP). For example, a mobile phone device 2402, a laptop computer device 2404, and a fixed location terminal device 2406 may include an integrated device 2400 as described herein. The integrated device 2400 may be, for example, any of the integrated circuits, dies, integrated devices, integrated circuit packages, integrated circuit devices, package-on-package devices described herein. The devices 2402, 2404, 2406 illustrated in FIG. 24 are merely exemplary. Other electronic devices may also feature the integrated device 2400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13, 14, 15, 16, 17, 18, 19A-19C, 20A-20C, 21, 22, 23 and/or 24 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9, 10, 11, 12, 13, 14, 15, 16, 17, 18, 19A-19C, 20A-20C, 21, 22, 23 and/or 24 and its corresponding description in the present disclosure is not limited to dies and/or ICs, in some implementations, FIGS. 2, 3, 4, 5, 6, 7, 8, 9, 10, 11, 12, 13, 14, 15, 16, 17, 18, 19A-19C, 20A-20C, 21, 22, 23 and/or 24 and its corresponding description may be used to manufacture, create, provide, and/or produce integrated devices. In some implementations, a device may include a die, a die package, an integrated circuit (IC), an integrated device, an integrated circuit package, a wafer, a semiconductor device, a package on package structure, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A substrate comprising:
   a substrate core layer;
   a first dielectric layer coupled to a first surface of the substrate core layer;
   a second dielectric layer coupled to a second surface of the substrate core layer;
   a magnetic core that includes:
      a core layer that includes a dielectric layer;
      a first thin film magnetic (TFM) layer coupled to a first non-horizontal side of the core layer;
      a second thin film magnetic (TFM) layer coupled to a second non-horizontal side of the core layer;
      a third thin film magnetic (TFM) layer coupled to a third horizontal side of the core layer; and
      a fourth thin film magnetic (TFM) layer being coupled to a fourth horizontal side of the core layer, wherein the fourth horizontal side of the core layer is opposite to the third horizontal side of the core layer,
      wherein the first thin film magnetic (TFM) layer, the second thin film magnetic (TFM) layer, the third thin film magnetic (TFM) layer and the fourth thin film magnetic (TFM) layer, each includes a thickness of about 1 micron (μm), and
   a first inductor formed by a plurality of first interconnects, wherein the first inductor is formed in the substrate such that the first inductor at least partially surrounds the magnetic core,
   wherein the plurality of first interconnects that forms the first inductor includes interconnects formed in the substrate core layer, the first dielectric layer and the second dielectric layer.

2. The substrate of claim 1, wherein a surface of the core layer is co planar with the first surface of the substrate core layer.

3. The substrate of claim 1, wherein the fourth thin film magnetic (TFM) layer is formed over the fourth horizontal side of the core layer and the first surface of the substrate core layer.

4. The substrate of claim 1, wherein the first thin film magnetic (TFM) layer, the second thin film magnetic (TFM) layer, the third thin film magnetic (TFM) layer and the fourth thin film magnetic (TFM) layer are a patterned thin film magnetic (TFM) layer.

5. The substrate of claim 1, wherein the third horizontal side of the core layer and the fourth horizontal side of the core layer is parallel with the first surface of the substrate core layer.

6. The substrate of claim 1, wherein the magnetic core is at least partially located in the first dielectric layer.

7. The substrate of claim 1, wherein the magnetic core is at least partially located in the substrate core layer.

8. The substrate of claim 1, wherein the first inductor comprises a solenoid inductor.

9. The substrate of claim 1, wherein the first non-horizontal thin film magnetic (TFM) layer comprises a metallic material or a non-metallic material.

10. The substrate of claim 1, wherein the magnetic core is surrounded by the first dielectric layer.

11. The substrate of claim 1, wherein the magnetic core is at least partially surrounded by the first dielectric layer and at least partially surrounded by the second dielectric layer.

12. The substrate of claim 1, further comprising a second inductor comprising a plurality of second interconnects.

13. The substrate of claim 12, wherein the first inductor and the second inductor are configured to operate as a coupled inductor or a transformer.

14. The substrate of claim 1, wherein the plurality of first interconnects comprises a trace, a via, and/or a pad.

15. The substrate of claim 1, wherein the substrate comprises a package substrate or an interposer.

16. The substrate of claim 1, wherein the substrate is implemented in an integrated circuit (IC) package comprising a die, such that the substrate is coupled to the die.

17. The substrate of claim 1, wherein the substrate is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

18. The substrate of claim 1, wherein the first thin film magnetic (TFM) layer, the second thin film magnetic (TFM) layer, the third thin film magnetic (TFM) layer, and the fourth thin film magnetic (TFM) layer are patterned in a shape of a spiral.

19. The substrate of claim 1, wherein the first inductor is configured to include an inductance (L) of about 5.7 or greater, when the first inductor operates at about 1 gigahertz or greater.

20. The substrate of claim 1, wherein the first inductor is configured to include a quality factor (Q) of about 83 or greater, when the first inductor operates at about 1 gigahertz or greater.

* * * * *